(12) United States Patent
Kim

(10) Patent No.: US 10,720,190 B2
(45) Date of Patent: Jul. 21, 2020

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Hyun Seung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/363,438

(22) Filed: Mar. 25, 2019

(65) Prior Publication Data

US 2020/0126600 A1  Apr. 23, 2020

(30) Foreign Application Priority Data

Oct. 22, 2018 (KR) ........................ 10-2018-0126219

(51) Int. Cl.
| | |
|---|---|
| G11C 7/10 | (2006.01) |
| G11C 7/22 | (2006.01) |
| G11C 29/52 | (2006.01) |
| G06F 13/40 | (2006.01) |
| G06F 13/24 | (2006.01) |
| H03K 19/20 | (2006.01) |

(52) U.S. Cl.
CPC ............ *G11C 7/1009* (2013.01); *G06F 13/24* (2013.01); *G06F 13/4068* (2013.01); *G11C 7/106* (2013.01); *G11C 7/109* (2013.01); *G11C 7/1048* (2013.01); *G11C 7/1057* (2013.01); *G11C 7/1063* (2013.01); *G11C 7/1084* (2013.01); *G11C 7/222* (2013.01); *G11C 29/52* (2013.01); *H03K 19/20* (2013.01)

(58) Field of Classification Search
CPC ... G11C 7/1009; G11C 7/1048; G11C 7/1057; G11C 7/106; G11C 7/1063; G11C 7/1084; G11C 7/109; G11C 7/222; G06F 13/24; G06F 13/4068; H03K 19/20
See application file for complete search history.

(56) References Cited

U.S. PATENT DOCUMENTS

| | | | | |
|---|---|---|---|---|
| 10,026,463 | B1 * | 7/2018 | Kwak | ..................... G11C 7/106 |
| 2004/0066700 | A1 * | 4/2004 | Lee | ....................... G11C 7/1021 |
| | | | | 365/232 |
| 2007/0002672 | A1 * | 1/2007 | Ha | ........................ G11C 7/1048 |
| | | | | 365/230.06 |
| 2008/0052567 | A1 * | 2/2008 | Lim | ..................... G11C 7/1078 |
| | | | | 714/718 |
| 2009/0006731 | A1 * | 1/2009 | Kwean | ................. G11C 7/1006 |
| | | | | 711/109 |

(Continued)

FOREIGN PATENT DOCUMENTS

KR    1020150062438 A    6/2015

*Primary Examiner* — Ly D Pham
(74) *Attorney, Agent, or Firm* — William Park & Associates Ltd.

(57) ABSTRACT

A semiconductor device includes a repeater configured to output latch data as aligned data when the operation control signal is disabled and configured to interrupt the input of the latch data when the operation control signal is enabled for performing a data masking operation of internal data. The operation control signal is enabled according to logic levels of the internal data when a flag signal is enabled and a write data control signal is enabled.

19 Claims, 16 Drawing Sheets

(56) References Cited

U.S. PATENT DOCUMENTS

| | | | | |
|---|---|---|---|---|
| 2012/0127809 A1* | 5/2012 | Ko | ............................ | G11C 7/12 |
| | | | | 365/193 |
| 2014/0331101 A1* | 11/2014 | Chung | .................. | G06F 11/085 |
| | | | | 714/755 |
| 2015/0194199 A1* | 7/2015 | Ko | ............................ | G11C 7/22 |
| | | | | 365/191 |
| 2016/0179377 A1* | 6/2016 | Yoon | ........................ | G06F 3/061 |
| | | | | 711/154 |
| 2017/0286218 A1* | 10/2017 | Kim | .................... | G06F 11/1048 |
| 2019/0279696 A1* | 9/2019 | Kim | ........................ | G11C 8/12 |

* cited by examiner

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2018-0126219, filed on Oct. 22, 2018, which is incorporated herein by reference in its entirety.

BACKGROUND

1. Technical Field

Embodiments of the present disclosure generally relate to semiconductor devices related to a data masking operation and a data bus inversion operation and semiconductor systems including the same.

2. Related Art

In a semiconductor system including a controller and a semiconductor device, a read operation or a write operation may be performed by transmission of data between the controller and the semiconductor device. During the read operation, data stored in the semiconductor device may be transmitted to the controller. During the write operation, data outputted from the controller may be transmitted to the semiconductor device and may be stored in memory cells of the semiconductor device. A data masking operation may be used to store only desired bits among bits of the data outputted from the controller into the memory cells of the semiconductor device. That is, if the data masking operation is performed, the semiconductor system may store only desired bits among the data outputted from the controller in the semiconductor device. In order that the data masking operation is performed in the semiconductor system, a data masking signal including information on data to be masked should be transmitted together with the data from the controller to the semiconductor device.

Meanwhile, if the number of data bits and phases of the data bits are changed when the data are transmitted in the semiconductor system increases, a simultaneous switching noise (SSN) phenomenon and an inter-symbol interface (ISI) phenomenon may occur more frequently. Recently, a data bus inversion (DBI) scheme has been used to suppress the SSN phenomenon and the ISI phenomenon.

SUMMARY

According to an embodiment, a semiconductor device may include a flag signal generation circuit and an operation control circuit. The flag signal generation circuit shifts a masked write command by a predetermined period to generate a flag signal. The operation control circuit generates an operation control signal for performing a data masking operation of internal data according to logic levels of the internal data when a write data control signal is inputted to the operation control circuit and the flag signal is enabled.

According to an embodiment, a semiconductor device may include a flag signal generation circuit, an operation control circuit and a repeater. The flag signal generation circuit shifts a write command and a masked write command by a predetermined period to generate a flag signal. The operation control circuit generates an operation control signal from a data inversion control signal or detects the number of bits having a predetermined logic level among bits included in internal data, according to a logic level of the flag signal. The repeater performs a data bus inversion operation of latch data generated from the internal data to generate aligned data or performs a data masking operation of the latch data to generate the aligned data, according to the operation control signal.

According to an embodiment, a semiconductor device may include a repeater configured to output latch data as aligned data when the operation control signal is disabled and configured to interrupt the input of the latch data when the operation control signal is enabled for performing a data masking operation of internal data. The operation control signal may be enabled according to logic levels of the internal data when a flag signal is enabled and a write data control signal is enabled. Wherein the repeater is configured to receive a data inversion control signal and inversely buffers the latch data to output the inversely buffered data of the latch data as the aligned data when the data inversion control signal is enabled and buffers the latch data to output the buffered data of the latch data as the aligned data when the data inversion control signal is disabled.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Further, the logic levels of the signals may be different from or the opposite of those described. For example, a signal described as having a logic "high" level may alternatively have a logic "low" level, and a signal described as having a logic "low" level may alternatively have a logic "high" level." In some embodiments, the logic "high" level may be greater than the logic "low" level. In some embodiments, a "high" logic level and a "low" logic level represent a signal that is enabled and disabled, respectively. In other embodiments, the "low" logic level and the "high" logic level represent a signal that is disabled and enabled, respectively.

Figure 1:
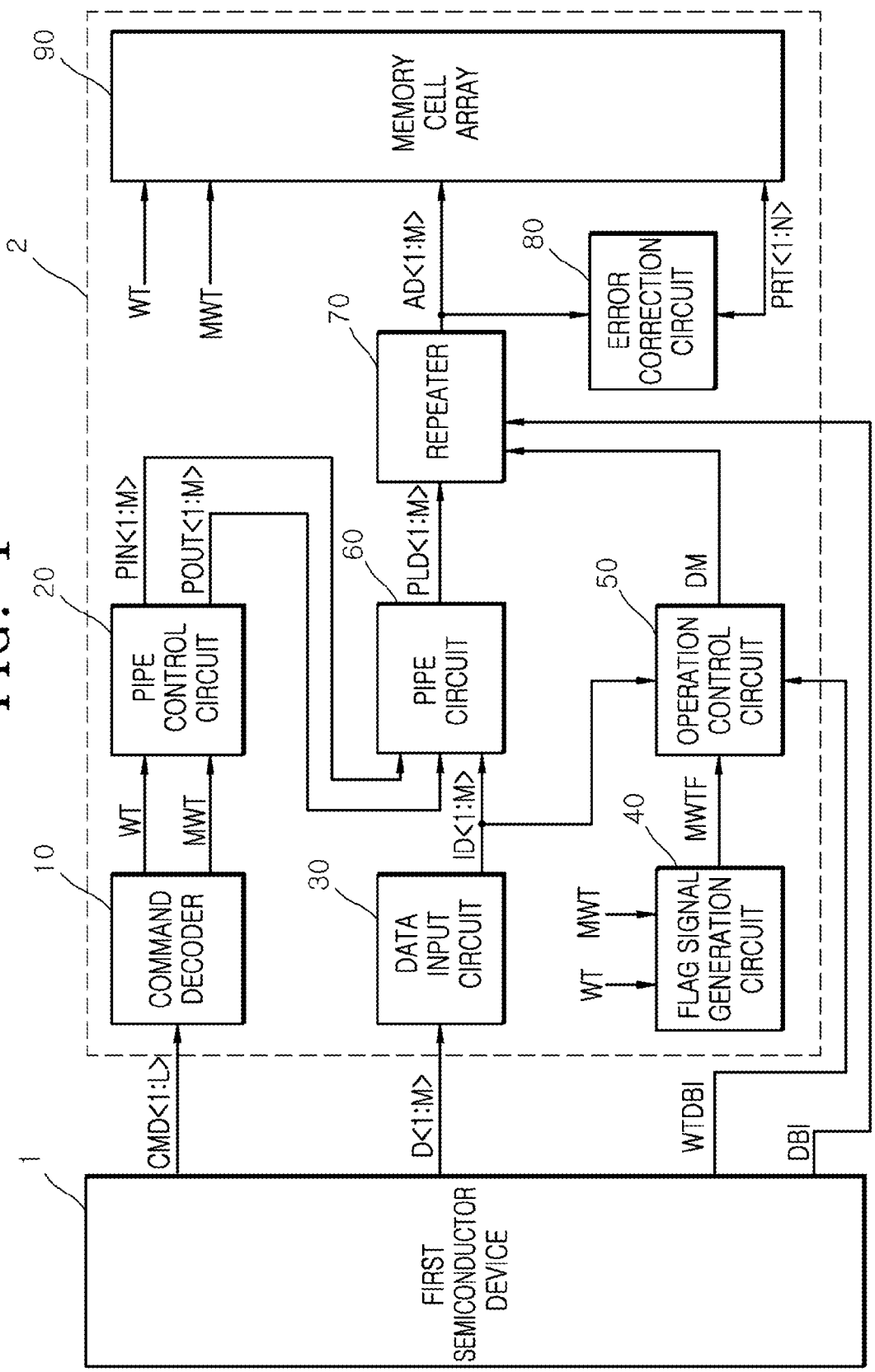
FIG. 1 is a block diagram illustrating a semiconductor system according to an embodiment of the present disclosure.

As illustrated in FIG. 1, a semiconductor system according to an embodiment may include a first semiconductor device 1 and a second semiconductor device 2.

The first semiconductor device 1 may apply a command CMD<1:L>, data D<1:M>, a write data control signal WTDBI and a data inversion control signal DBI to the second semiconductor device 2. The command CMD<1:L> may be set to have various logic level combinations for controlling operations of the second semiconductor device 2. The number "L" of bits included in the command CMD<1:L> may be set to be different according to the embodiments. The number "M" of bits included in the data D<1:M> may be set to be different according to the embodiments. The write data control signal WTDBI may be set to be a signal which is enabled to perform a data bus inversion operation during a write operation and a masked write operation. The data inversion control signal DBI may be set to be a signal which is enabled to perform the data bus inversion operation.

The second semiconductor device 2 may include a command decoder 10, a pipe control circuit 20, a data input circuit 30, a flag signal generation circuit 40, an operation control circuit 50, a pipe circuit 60, a repeater 70, an error correction circuit 80 and a memory cell array 90.

The command decoder 10 may decode the command CMD<1:L> to generate a write command WT and a masked write command MWT. The write command WT may be set as a signal for performing the write operation that stores the data D<1:M> into the second semiconductor device 2. The masked write command MWT may be set as a signal for performing the masked write operation that successively executes the write operation after an internal read operation of the second semiconductor device 2. Logic level combinations of the command CMD<1:L> for generating the write command WT and the masked write command MWT may be set to be different according to the embodiments.

The pipe control circuit 20 may generate a pipe input control signal PIN<1:M> and a pipe output control signal POUT<1:M> according to the write command WT and the masked write command MWT. If the write operation is performed, the pipe control circuit 20 may sequentially generate the pipe input control signal PIN<1:M> and the pipe output control signal POUT<1:M>. If the write command WT is generated, the pipe control circuit 20 may sequentially generate the pipe input control signal PIN<1:M> and the pipe output control signal POUT<1:M>. If the masked write operation is performed, the pipe control circuit 20 may sequentially generate the pipe input control signal PIN<1:M> and the pipe output control signal POUT<1:M>. If the masked write command MWT is generated, the pipe control circuit 20 may sequentially generate the pipe input control signal PIN<1:M> and the pipe output control signal POUT<1:M>. The pipe control circuit 20 may generate the pipe input control signal PIN<1:M> at a point of time when a first delay period elapses from a point of time when the write command WT or the masked write command MWT is generated. The pipe control circuit 20 may generate the pipe output control signal POUT<1:M> at a point of time when a second delay period elapses from a point of time when the pipe input control signal PIN<1:M> is generated. The first delay period and the second delay period may be set to be different according to the embodiments.

The data input circuit 30 may generate internal data ID<1:M> from the data D<1:M>. The data input circuit 30 may buffer the data D<1:M> outputted from the first semiconductor device 1 to generate the internal data ID<1:M> while the write operation is performed.

The flag signal generation circuit 40 may shift the write command WT and the masked write command MWT by a predetermined period to generate a flag signal MWTF. The predetermined period may be set as an operation time for detecting the number of bits having a predetermined logic level among the bits included in the internal data ID<1:M>. The predetermined logic level for the internal data ID<1:M> may be set as a logic "low" level.

The word "predetermined" as used herein with respect to a parameter, such as a predetermined period, predetermined number, or predetermined logic level etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The operation control circuit 50 may detect the number of the predetermined logic levels included in the internal data ID<1:M> if the write data control signal WTDBI is inputted to the operation control circuit 50 and the flag signal MWTF is enabled. The operation control circuit 50 may generate an operation control signal DM for performing a data masking operation of the internal data ID<1:M> according to the detection result for the number of the predetermined logic levels included in the internal data ID<1:M>. The operation control signal DM may be enabled if the number of the predetermined logic levels included in the internal data ID<1:M> is equal to or greater than a predetermined number.

The pipe circuit 60 may generate latch data PLD<1:M> from the internal data ID<1:M> according to the pipe input control signal PIN<1:M> and the pipe output control signal POUT<1:M>. The pipe circuit 60 may latch the internal data ID<1:M> if the pipe input control signal PIN<1:M> is enabled. The pipe circuit 60 may output the latched data of the internal data ID<1:M> as the latch data PLD<1:M> if the pipe output control signal POUT<1:M> is enabled.

The repeater 70 may output the latch data PLD<1:M> as aligned data AD<1:M> according to the operation control signal DM. The repeater 70 may output the latch data PLD<1:M> as the aligned data AD<1:M> if the operation control signal DM is disabled. The repeater 70 may perform the data masking operation interrupting the input of the latch data PLD<1:M> if the operation control signal DM is enabled. The repeater 70 may output the latch data PLD<1:M> as the aligned data AD<1:M> according to the data inversion control signal DBI. The repeater 70 may buffer the latch data PLD<1:M> to output the buffered data of the latch data PLD<1:M> as the aligned data AD<1:M> if the data inversion control signal DBI is disabled. The repeater 70 may perform the data bus inversion operation for inversely buffering the latch data PLD<1:M> to output the inversely buffered data of the latch data PLD<1:M> as the aligned data AD<1:M> if the data inversion control signal DBI is enabled.

The error correction circuit 80 may detect errors of the aligned data AD<1:M> to generate a parity PRT<1:N> including information on the errors of the aligned data AD<1:M> while the write operation is performed. The error correction circuit 80 may correct the errors of the aligned data AD<1:M> according to the parity PRT<1:N> outputted from the memory cell array 90 while the internal read operation is performed during the masked write operation. The error correction circuit 80 may detect the errors of the aligned data AD<1:M> to generate the parity PRT<1:N> including the error information while the write operation is performed during the masked write operation.

The memory cell array 90 may store the aligned data AD<1:M> and the parity PRT<1:N> during the write operation. The memory cell array 90 may store the aligned data AD<1:M> and the parity PRT<1:N> if the write command WT is generated. The memory cell array 90 may store corrected data of the aligned data AD<1:M> and the parity PRT<1:N> after outputting the aligned data AD<1:M> and the parity PRT<:N> stored therein while the masked write operation is performed. The memory cell array 90 may output the aligned data AD<1:M> and the parity PRT<1:N> stored therein during the internal read operation if the masked write command MWT is generated. The memory cell array 90 may store the corrected data of the aligned data AD<1:M> and the parity PRT<1:N> during the write operation if the masked write command MWT is generated. The memory cell array 90 may include a region for storing the aligned data AD<1:M> and a region for storing the parity PRT<1:N>.

The second semiconductor device 2 may perform the data bus inversion operation of the data D<1:M> if the data inversion control signal DBI is inputted to the second semiconductor device 2 during the write operation. The second semiconductor device 2 may detect the number of the predetermined logic levels included in the data D<1:M> and may perform the data masking operation of the data D<1:M> according to the detection results, if the write data control signal WTDBI is inputted to the second semiconductor device 2 during the masked write operation.

Figure 2:
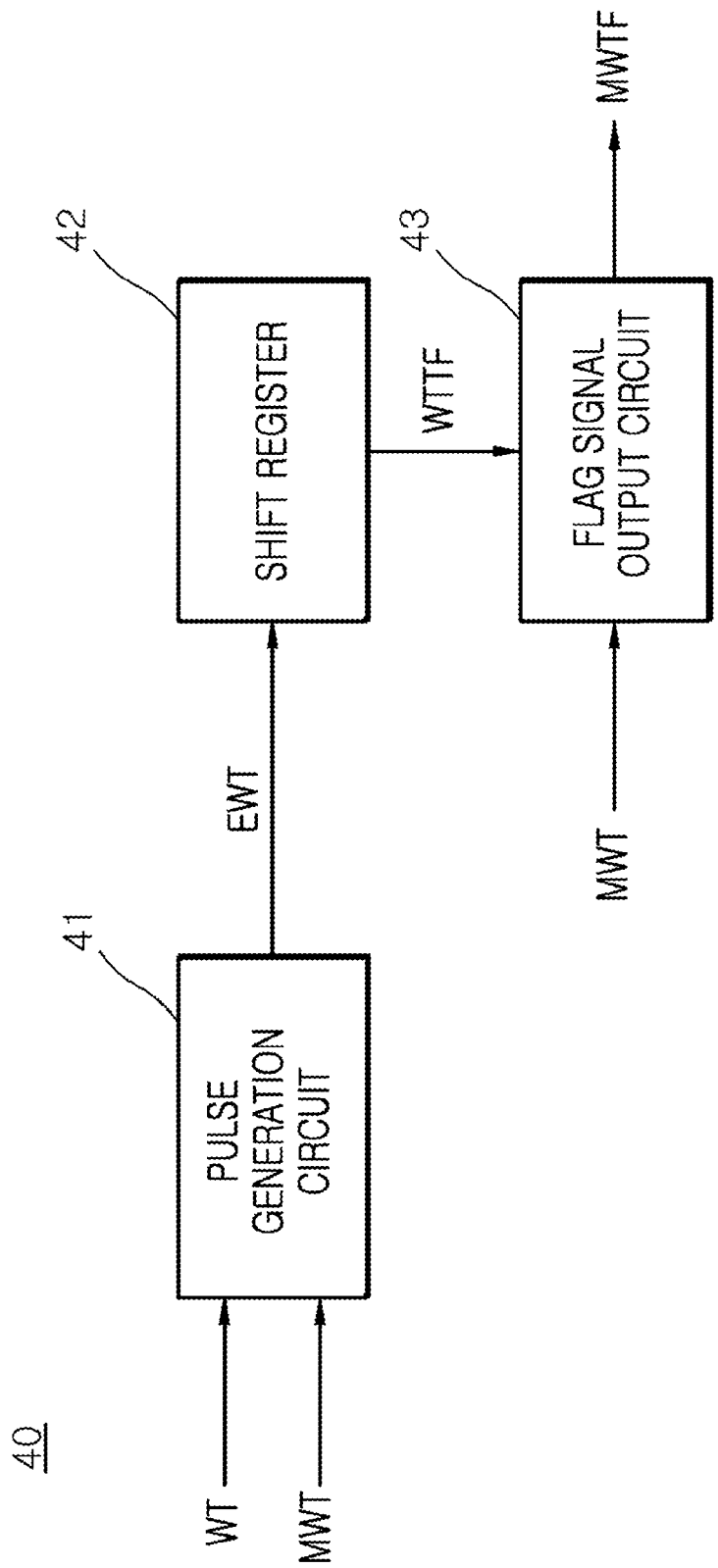
FIG. 2 is a block diagram illustrating a configuration of a flag signal generation circuit included in a second semiconductor device of the semiconductor system shown in FIG. 1.

Referring to FIG. 2, the flag signal generation circuit 40 may include a pulse generation circuit 41, a shift register 42 and a flag signal output circuit 43.

The pulse generation circuit 41 may generate an internal pulse signal EWT including a pulse which is created if the write command WT and the masked write command MWT are inputted to the pulse generation circuit 41. The pulse generation circuit 41 may generate the internal pulse signal EWT including a pulse which is created if the write command WT is enabled to have a logic "high" level. The pulse generation circuit 41 may generate the internal pulse signal EWT including a pulse which is created if the masked write command MWT is enabled to have a logic "high" level.

The shift register 42 may shift the internal pulse signal EWT to generate a write pulse signal WTTF. The shift register 42 may shift the internal pulse signal EWT by a write latency period to generate the write pulse signal WTTF. A period by which the internal pulse signal EWT is delayed may be set to be different according to the embodiments.

The flag signal output circuit 43 may latch the masked write command MWT to generate the flag signal MWTF, at a point of time when the write pulse signal WTTF is inputted to the flag signal output circuit 43. The flag signal output circuit 43 may shift the latched signal of the masked write command MWT by a predetermined period to output the shifted signal of the masked write command MWT as the flag signal MWTF. The predetermined period may be set as an operation time for detecting the number of the predetermined logic levels included in the internal data ID<1:M>, as described above.

Figure 3:
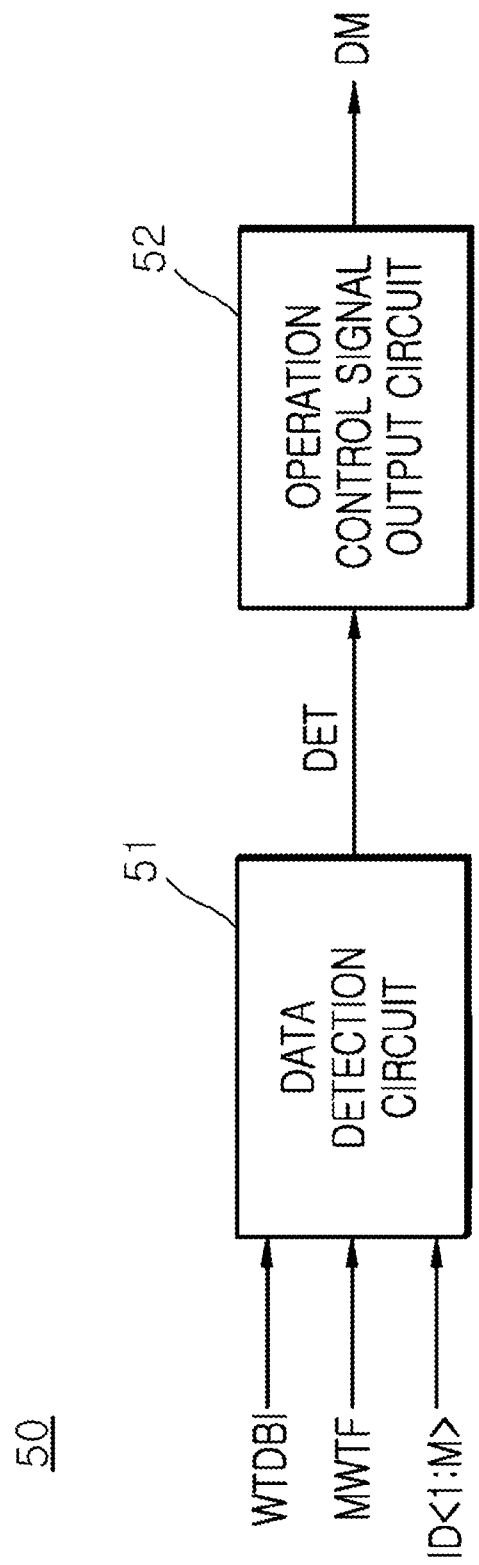
FIG. 3 is a block diagram illustrating a configuration of an operation control circuit included in a second semiconductor device of the semiconductor system shown in FIG. 1.

Referring to FIG. 3, the operation control circuit 50 may include a data detection circuit 51 and an operation control signal output circuit 52.

The data detection circuit 51 may detect logic levels of the internal data ID<1:M> according to the write data control signal WTDBI and the flag signal MWTF to generate a detection signal DET. The data detection circuit 51 may detect the number of logic "low" levels included in the internal data ID<1:M> to generate the detection signal DET, if the write data control signal WTDBI is enabled and the flag signal MWTF is enabled. The data detection circuit 51 may generate the detection signal DET which is enabled if the number of logic "low" levels included in the internal data ID<1:M> is at least two while the write data control signal WTDBI is enabled and the flag signal MWTF is enabled.

The operation control signal output circuit 52 may buffer the detection signal DET to output the buffered signal of the detection signal DET as the operation control signal DM. The operation control signal output circuit 52 may delay the detection signal DET to generate the operation control signal DM. A delay time of the detection signal DET may be set to be different according to the embodiments.

Figure 4:
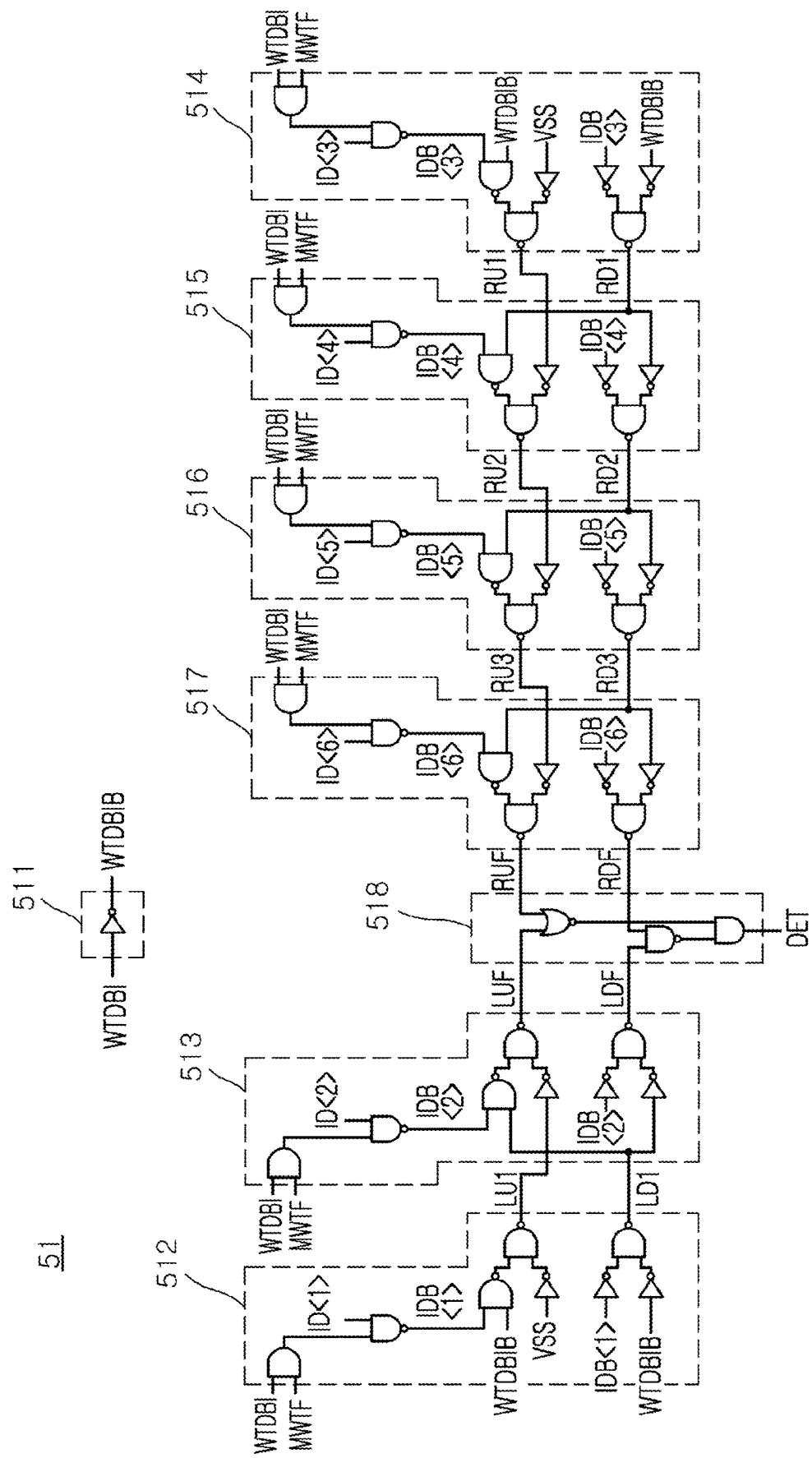
FIG. 4 is a circuit diagram illustrating a configuration of a data detection circuit included in the operation control circuit of FIG. 3.

Referring to FIG. 4, the data detection circuit 51 may include an inversion circuit 511, a first discrimination circuit 512, a second discrimination circuit 513, a third discrimination circuit 514, a fourth discrimination circuit 515, a fifth discrimination circuit 516, a sixth discrimination circuit 517 and a detection signal generation circuit 518. In FIG. 4, it may be assumed that the number 'M' of bits included in the internal data ID<1:M> is six. That is, the internal data ID<1:M> may include first to sixth internal data ID<1:6>.

The inversion circuit 511 may inversely buffer the write data control signal WTDBI to generate an inverted write data control signal WTDBIB.

The first discrimination circuit 512 may inversely buffer the first internal data ID<1> to generate a first inverted internal data IDB<1> if the write data control signal WTDBI is enabled to have a logic "high" level and the flag signal MWTF is enabled to have a logic "high" level. The first discrimination circuit 512 may generate a first left-up signal LU1 having a logic "low" level regardless of the first inverted internal data IDB<1> if the inverted write data control signal WTDBIB is generated to have a logic "low" level. The first discrimination circuit 512 may buffer the first inverted internal data IDB<1> to generate a first left-down signal LD1 if the inverted write data control signal WTDBIB is generated to have a logic "low" level. The first discrimination circuit 512 may generate the first left-down signal LD1 which is enabled to have a logic "high" level if the inverted write data control signal WTDBIB has a logic "low" level and the first inverted internal data IDB<1> has a logic "high" level. In an embodiment, the first discrimination circuit 512 may perform inversion, NAND operations, and AND operations, and may include a combination of inverters, NAND logic gates, and AND logic gates as illustrated in FIG. 4. In an embodiment, the first discrimination circuit 512 may receive a ground voltage VSS.

The second discrimination circuit 513 may inversely buffer the second internal data ID<2> to generate a second inverted internal data IDB<2> if the write data control signal WTDBI is enabled to have a logic "high" level and the flag signal MWTF is enabled to have a logic "high" level. The second discrimination circuit 513 may generate a left-up flag LUF having a logic "low" level regardless of the second inverted internal data IDB<2> if the first left-up signal LU1 is generated to have a logic "low" level and the first left-down signal LD1 is generated to have a logic "low" level. The second discrimination circuit 513 may buffer the second inverted internal data IDB<2> to generate a left-down flag LDF if the first left-down signal LD1 is generated to have a logic "low" level. The second discrimination circuit 513 may buffer the second inverted internal data IDB<2> to generate the left-up flag LUF if the first left-up signal LU1 is generated to have a logic "low" level and the first left-down signal LD1 is generated to have a logic "high" level. The second discrimination circuit 513 may generate the left-down flag LDF which is enabled to have a logic "high" level regardless of the second inverted internal data IDB<2> if the first left-down signal LD1 is generated to have a logic "high" level. In an embodiment, the second discrimination circuit 513 may perform inversion, NAND operations, and AND operations, and may include a combination of inverters, NAND logic gates, and AND logic gates as illustrated in FIG. 4.

The third discrimination circuit 514 may inversely buffer the third internal data ID<3> to generate a third inverted internal data IDB<3> if the write data control signal WTDBI is enabled to have a logic "high" level and the flag signal MWTF is enabled to have a logic "high" level. The third discrimination circuit 514 may generate a first right-up signal RU1 having a logic "low" level regardless of the third inverted internal data IDB<3> if the inverted write data control signal WTDBIB is generated to have a logic "low" level. The third discrimination circuit 514 may buffer the third inverted internal data IDB<3> to generate a first right-down signal RD1 if the inverted write data control signal WTDBIB is generated to have a logic "low" level. The third discrimination circuit 514 may generate the first right-down signal RD1 which is enabled to have a logic "high" level if the inverted write data control signal WTDBIB has a logic "low" level and the third inverted internal data IDB<3> has a logic "high" level. In an embodiment, the third discrimination circuit 514 may perform inversion, NAND operations, and AND operations, and may include a combination of inverters, NAND logic gates, and AND logic gates as illustrated in FIG. 4. In an embodiment, the third discrimination circuit 514 may receive a ground voltage VSS.

The fourth discrimination circuit 515 may inversely buffer the fourth internal data ID<4> to generate a fourth inverted internal data IDB<4> if the write data control signal WTDBI is enabled to have a logic "high" level and the flag signal MWTF is enabled to have a logic "high" level. The fourth discrimination circuit 515 may generate a second right-up signal RU2 having a logic "low" level regardless of the fourth inverted internal data IDB<4> if the first right-up signal RU1 is generated to have a logic "low" level and the first right-down signal RD1 is generated to have a logic "low" level. The fourth discrimination circuit 515 may buffer the fourth inverted internal data IDB<4> to generate a second right-down signal RD2 if the first right-down signal RD1 is generated to have a logic "low" level. The fourth discrimination circuit 515 may buffer the fourth inverted internal data IDB<4> to generate the second right-up signal RU2 if the first right-up signal RU1 is generated to have a logic "low" level and the first right-down signal RD1 is generated to have a logic "high" level. The fourth discrimination circuit 515 may generate the second right-down signal RD2 which is enabled to have a logic "high" level regardless of the fourth inverted internal data IDB<4> if the first right-down signal RD1 is generated to have a logic "high" level. In an embodiment, the fourth discrimination circuit 515 may perform inversion, NAND operations, and AND operations, and may include a combination of inverters, NAND logic gates, and AND logic gates as illustrated in FIG. 4.

The fifth discrimination circuit 516 may inversely buffer the fifth internal data ID<5> to generate a fifth inverted internal data IDB<5> if the write data control signal WTDBI is enabled to have a logic "high" level and the flag signal MWTF is enabled to have a logic "high" level. The fifth discrimination circuit 516 may generate a third right-up signal RU3 having a logic "low" level regardless of the fifth inverted internal data IDB<5> if the second right-up signal RU2 is generated to have a logic "low" level and the second right-down signal RD2 is generated to have a logic "low" level. The fifth discrimination circuit 516 may buffer the fifth inverted internal data IDB<5> to generate a third right-down signal RD3 if the second right-down signal RD2 is generated to have a logic "low" level. The fifth discrimination circuit 516 may buffer the fifth inverted internal data IDB<5> to generate the third right-up signal RU3 if the second right-up signal RU2 is generated to have a logic "low" level and the second right-down signal RD2 is generated to have a logic "high" level. The fifth discrimination circuit 516 may generate the third right-down signal RD3 which is enabled to have a logic "high" level regardless of the fifth inverted internal data IDB<5> if the second right-down signal RD2 is generated to have a logic "high" level. In an embodiment, the fifth discrimination circuit 516 may perform inversion, NAND operations, and AND operations, and may include a combination of inverters, NAND logic gates, and AND logic gates as illustrated in FIG. 4.

The sixth discrimination circuit 517 may inversely buffer the sixth internal data ID<6> to generate a sixth inverted internal data IDB<6> if the write data control signal WTDBI is enabled to have a logic "high" level and the flag signal MWTF is enabled to have a logic "high" level. The sixth discrimination circuit 517 may generate a right-up flag RUF having a logic "low" level regardless of the sixth inverted internal data IDB<6> if the third right-up signal RU3 is generated to have a logic "low" level and the third right-down signal RD3 is generated to have a logic "low" level. The sixth discrimination circuit 517 may buffer the sixth inverted internal data IDB<6> to generate a right-down flag RDF if the third right-down signal RD3 is generated to have a logic "low" level. The sixth discrimination circuit 517 may buffer the sixth inverted internal data IDB<6> to generate the right-up flag RUF if the third right-up signal RU3 is generated to have a logic "low" level and the third right-down signal RD3 is generated to have a logic "high" level.

The sixth discrimination circuit 517 may generate the right-down flag RDF which is enabled to have a logic "high" level regardless of the sixth inverted internal data IDB<6> if the third right-down signal RD3 is generated to have a logic "high" level. In an embodiment, the sixth discrimination circuit 517 may perform inversion, NAND operations, and AND operations, and may include a combination of inverters, NAND logic gates, and AND logic gates as illustrated in FIG. 4.

The detection signal generation circuit 518 may generate the detection signal DET which is disabled to have a logic "low" level if any one of the left-up flag LUF and the right-up flag RUF has a logic "high" level. The detection signal generation circuit 518 may generate the detection signal DET which is disabled to have a logic "low" level if both of the left-down flag LDF and the right-down flag RDF have a logic "high" level. The detection signal generation circuit 518 may generate the detection signal DET which is enabled to have a logic "high" level if both of the left-up flag LUF and the right-up flag RUF have a logic "low" level and any one of the left-down flag LDF and the right-down flag RDF has a logic "low" level. In an embodiment, the detection signal generation circuit 518 may perform NOR operations, NAND operations, and AND operations, and may include a combination of NOR logic gates, NAND logic gates, and AND logic gates as illustrated in FIG. 4.

The data detection circuit 51 may generate the detection signal DET which is disabled to have a logic "low" level if the number of bits having a logic "low" level among the first to sixth internal data ID<1:6> is at least two. The data detection circuit 51 may generate the detection signal DET which is enabled to have a logic "high" level if the number of bits having a logic "high" level among the first to sixth internal data ID<1:6> is at most one. Although FIG. 4 illustrates an example in which the data detection circuit 51 is realized to detect logic levels of six internal data, the number of bits included in the internal data may be set to be less or more than six according to the embodiments.

Figure 5:
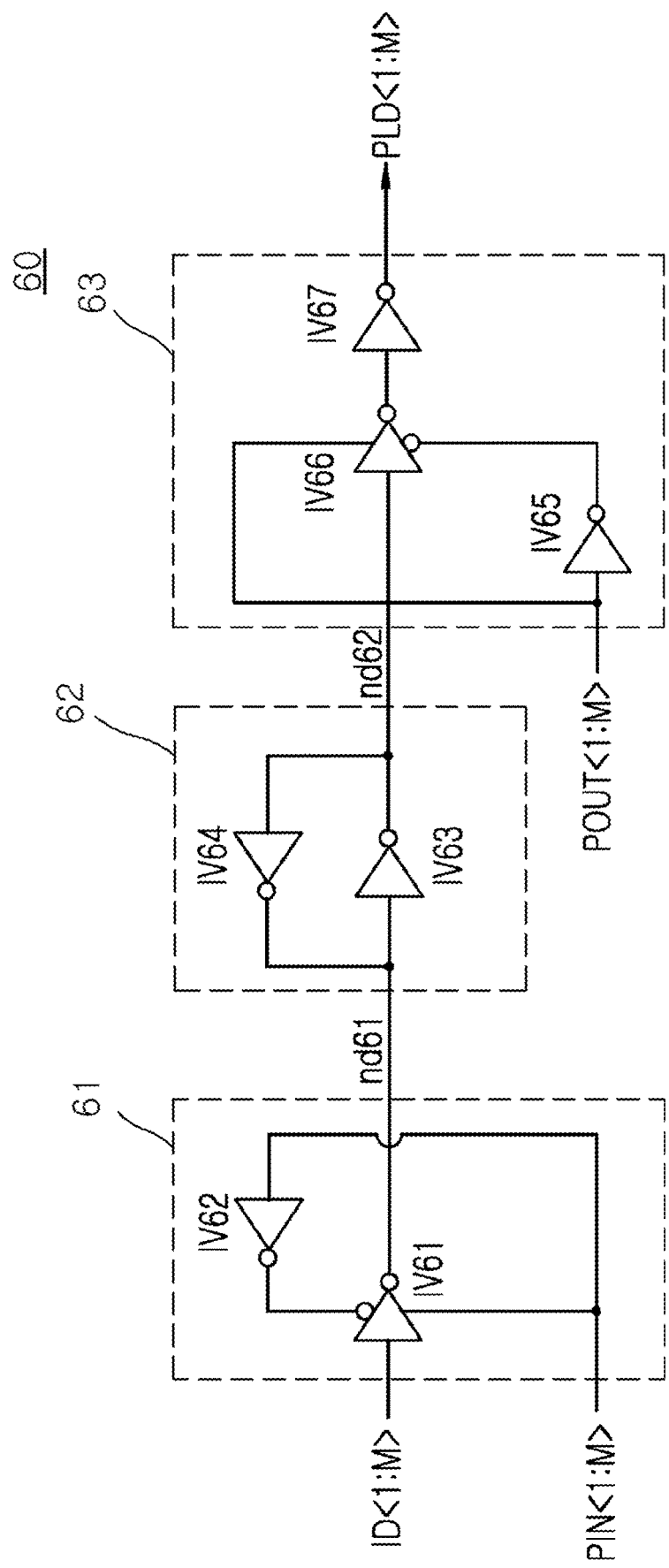
FIG. 5 is a circuit diagram illustrating a configuration of a pipe circuit included in a second semiconductor device of the semiconductor system shown in FIG. 1.

Referring to FIG. 5, the pipe circuit 60 may include an internal data input circuit 61, a latch circuit 62 and a latch data output circuit 63.

The internal data input circuit 61 may perform inversion operations and may include, for example but not limited to, inverters IV61 and IV62. The inverter IV61 may be turned on if the write operation and the masked write operation are performed to generate the pipe input control signal PIN<1:M> having a logic "high" level. The inverter IV61 may inversely buffer the internal data ID<1:M> to output the inversely buffered data of the internal data ID<1:M> to a node nd61 if the write operation and the masked write operation are performed to generate the pipe input control signal PIN<1:M> having a logic "high" level. Although FIG. 5 illustrates the internal data input circuit 61 with a single circuit including the inverter IV61 and the inverter IV62, the internal data input circuit 61 may actually be realized using "M"-number of circuits, each of which receives one of the bits included in the internal data ID<1:M> and one of the bits included in the pipe input control signal PIN<1:M>.

The latch circuit 62 may perform inversion operations and may include, for example but not limited to, inverters IV63 and IV64. The inverter IV63 may inversely buffer a signal of the node nd61 to output the inversely buffered signal of the signal of the node nd61 to a node nd62. The inverter IV64 may inversely buffer a signal of the node nd62 to output the inversely buffered signal of the signal of the node nd62 to the node nd61. The latch circuit 62 may latch the signals of the nodes nd61 and nd62 while the node nd61 is not driven. Although FIG. 5 illustrates the latch circuit 62 with a single circuit including the inverter IV63 and the inverter IV64, the latch circuit 62 may actually be realized using "M"-number of circuits, each of which corresponds to one of the bits included in the internal data ID<1:M>.

The latch data output circuit 63 may perform inversion operations and may include, for example but not limited to, inverters IV65, IV66 and IV67. The inverter IV65 may inversely buffer the pipe output control signal POUT<1:M> to output the inversely buffered signal of the pipe output control signal POUT<1:M>. The inverter IV66 may inversely buffer the signal of the node nd62 to output the inversely buffered signal of the signal of the node nd62 if the pipe output control signal POUT<1:M> is generated to have a logic "high" level. The inverter IV67 may inversely buffer an output signal of the inverter IV66 to output the inversely buffered signal of the output signal of the inverter IV66 as the latch data PLD<1:M>. Although FIG. 5 illustrates the latch data output circuit 63 with a single circuit including the inverters IV65, IV66 and IV67, the latch data output circuit 63 may actually be realized using "M"-number of circuits, each of which corresponds to one of the bits included in the internal data ID<1:M>.

Figure 6:
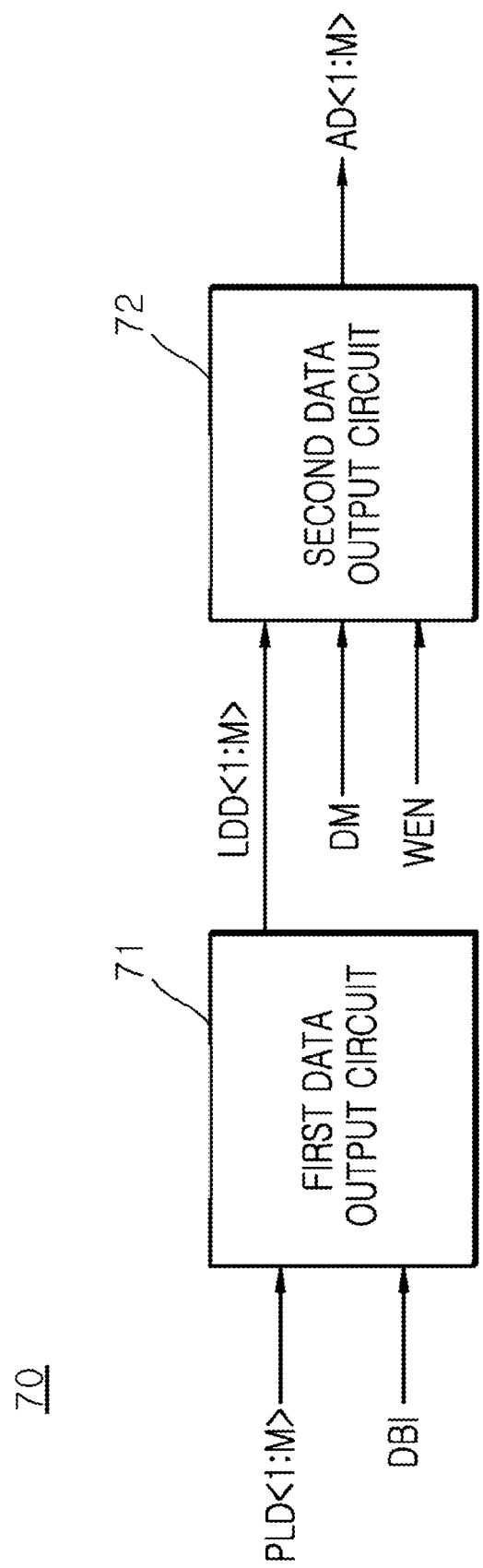
FIG. 6 is a block diagram illustrating a configuration of a repeater included in a second semiconductor device of the semiconductor system shown in FIG. 1.

Referring to FIG. 6, the repeater 70 may include a first data output circuit 71 and a second data output circuit 72.

The first data output circuit 71 may perform the data bus inversion operation according to a logic level of the data inversion control signal DBI to generate a delayed latch data LDD<1:M> from the latch data PLD<1:M>. The first data output circuit 71 may buffer or inversely buffer the latch data PLD<1:M> according to a logic level of the data inversion control signal DBI to generate and output the delayed latch data LDD<1:M>.

The second data output circuit 72 may perform the data masking operation to generate the aligned data AD<1:M> from the delayed latch data LDD<1:M> according to the operation control signal DM and a write enablement signal WEN. The second data output circuit 72 may output the delayed latch data LDD<1:M> as the aligned data AD<1:M> or may interrupt the input of the delayed latch data LDD<1:M> according to the operation control signal DM and the write enablement signal WEN.

Figure 7:
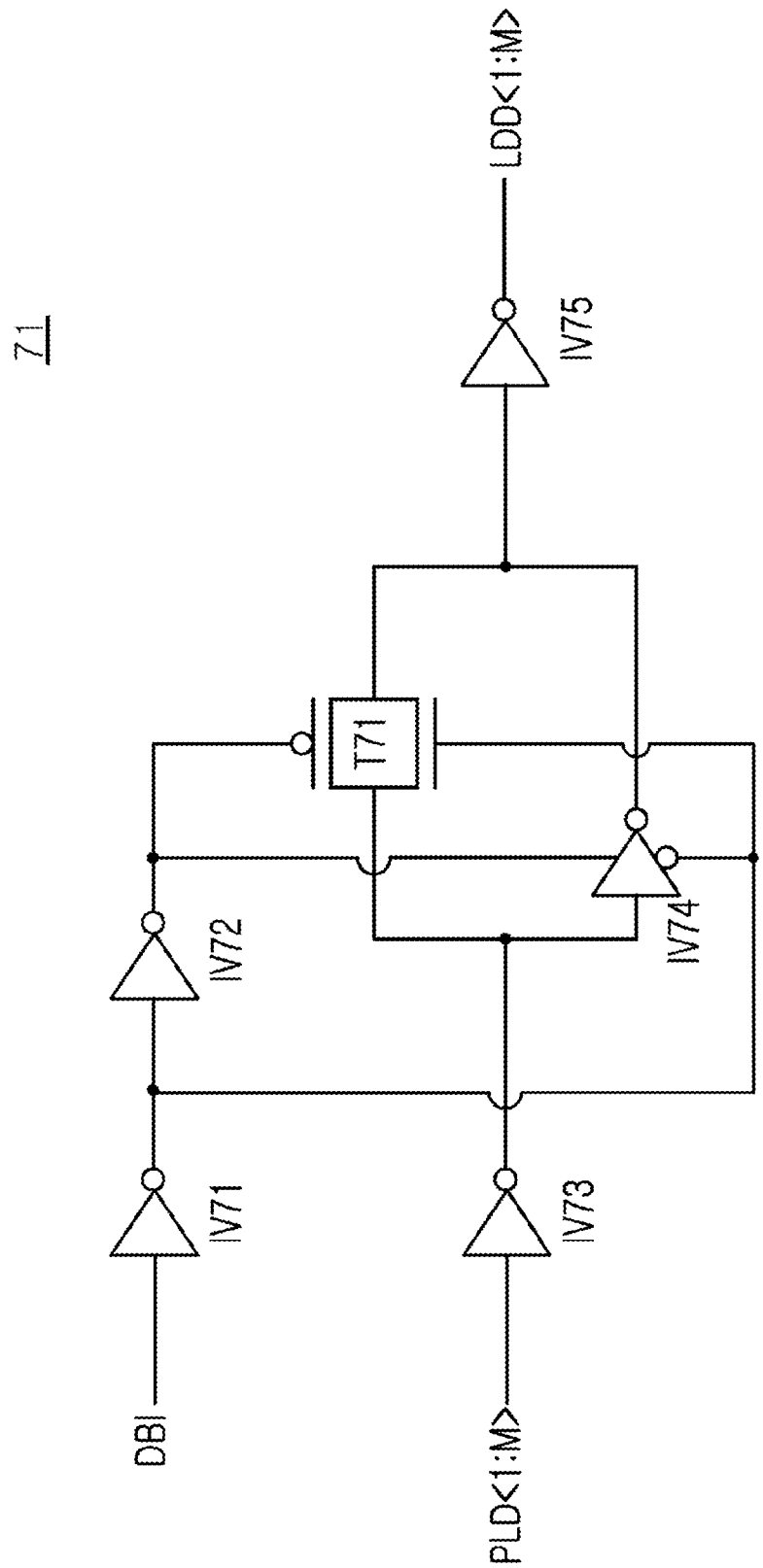
FIG. 7 is a circuit diagram illustrating a configuration of a first data output circuit included in the repeater of FIG. 6.

Referring to FIG. 7, the first data output circuit 71 may perform inversion operations and transfer gate operations and may include, for example but not limited to, inverters IV71, IV72, IV73, IV74 and IV75 and a transfer gate T71. The inverter IV74 may be realized using a three-phase inverter.

The inverters IV71 and IV72 may be sequentially coupled in series, and the data inversion control signal DBI may be applied to an input terminal of the inverter IV71. An output terminal of the inverter IV71 may be coupled to a positive control terminal of the transfer gate T71, and an output terminal of the inverter IV72 may be coupled to a negative control terminal of the transfer gate T71. In addition, the output terminal of the inverter IV71 may be coupled to a negative control terminal of the inverter IV74, and the output terminal of the inverter IV72 may be coupled to a positive control terminal of the inverter IV74. The latch data PLD<1:M> may be applied to an input terminal of the inverter IV73, and an output terminal of the inverter IV73 may be coupled to both of an input terminal of the transfer gate T71 and an input terminal of the inverter IV74. An output terminal of the transfer gate T71 and an output terminal of the inverter IV74 may be coupled to an input terminal of the inverter IV75, and the delayed latch data LDD<1:M> may be outputted through an output terminal of the inverter IV75.

If the data inversion control signal DBI has a logic "high" level, the transfer gate T71 may be turned off and the inverter IV74 may be turned on. In such a case, the latch data PLD<1:M> may be inversely buffered through the inverters IV73, IV74 and IV75 to generate the delayed latch data LDD<1:M>.

If the data inversion control signal DBI has a logic "low" level, the transfer gate T71 may be turned on and the inverter IV74 may be turned off. In such a case, the latch data PLD<1:M> may be buffered through the inverters IV73 and IV75 and the transfer gate T71 to generate the delayed latch data LDD<1:M>.

Although FIG. 7 illustrates the first data output circuit 71 with a single circuit including the inverters IV71~IV75 and the transfer gate T71, the first data output circuit 71 may actually be realized using "M"-number of circuits, each of which receives one of the bits included in the latch data PLD<1:M>.

Figure 8:
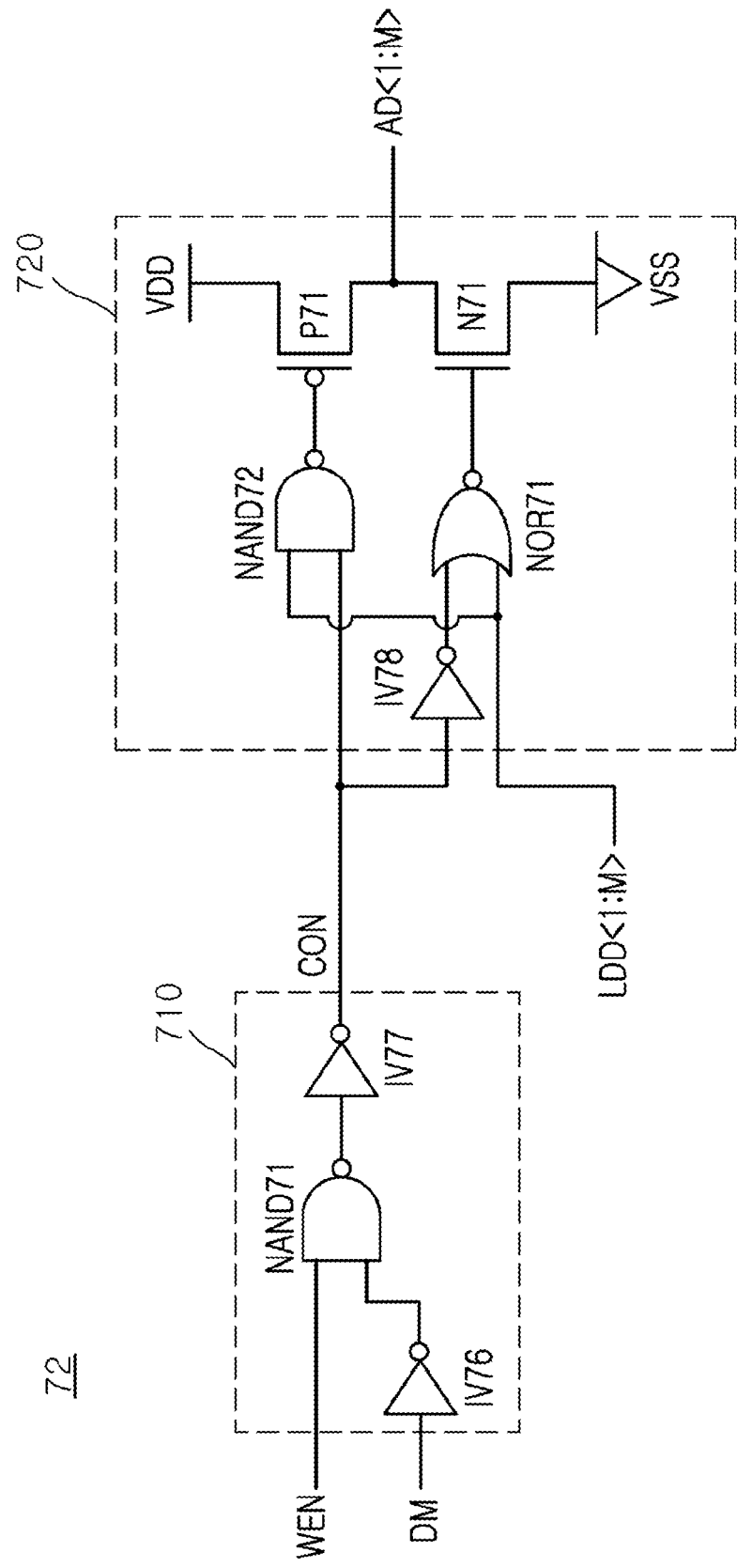
FIG. 8 is a circuit diagram illustrating a configuration of a second data output circuit included in the repeater of FIG. 6.

Referring to FIG. 8, the second data output circuit 72 may include a control signal generation circuit 710 and a buffer circuit 720.

The control signal generation circuit 710 may perform inversion and NAND operations and may include, for example but not limited to, inverters IV76 and IV77 and a NAND gate NAND71. The control signal generation circuit 710 may generate a control signal CON according to a logic level of the operation control signal DM during a period that the write enablement signal WEN is enabled. The control signal generation circuit 710 may generate the control signal CON having a logic "high" level if the operation control signal DM has a logic "low" level during a period that the write enablement signal WEN is enabled to have a logic "high" level. The control signal generation circuit 710 may generate the control signal CON having a logic "low" level if the operation control signal DM has a logic "high" level during a period that the write enablement signal WEN is enabled to have a logic "high" level. The write enablement signal WEN may be set as a signal which is enabled to have a logic "high" level while the masked write operation is performed.

The buffer circuit 720 may perform inversion operations, NOR operations, pull-up and pull-down operations, and NAND operations and may include, for example but not limited to, an inverter IV78, a NAND gate NAND72, a NOR gate NOR71, a PMOS transistor P71 and an NMOS transistor N71. The buffer circuit 720 may generate the aligned data AD<1:M> from the delayed latch data LDD<1:M> according to a logic level of the control signal CON. The buffer circuit 720 may buffer the delayed latch data LDD<1:M> to generate the aligned data AD<1:M> if the control signal CON has a logic "high" level. e buffer circuit 720 may interrupt the input of the delayed latch data LDD<1:M> if the control signal CON has a logic "low" level. In an embodiment, the PMOS transistor P71 receives a supply voltage VDD and the NMOS transistor N71 receives a ground voltage VSS.

Although FIG. 8 illustrates the second data output circuit 72 with a single circuit including the control signal generation circuit 710 and the buffer circuit 720, the second data output circuit 72 may be actually realized using "M"-number of circuits, each of which corresponds to one of bits included in the latch data PLD<1:M>.

As described above, a semiconductor system according to an embodiment may perform a data bus inversion operation based on a data inversion control signal during a write operation. The semiconductor system may interrupt the execution of a data masking operation by disabling a flag signal after a predetermined period for detecting a predetermined logic level included in data during the write operation. The semiconductor system may detect the predetermined logic level included in the data to perform a data masking operation according to the detection results during a masked write operation. Thus, the semiconductor system may perform the data masking operation only during the masked write operation to prevent errors of the write operation from occurring because no parity is generated from masked data during the write operation.

Figure 9:
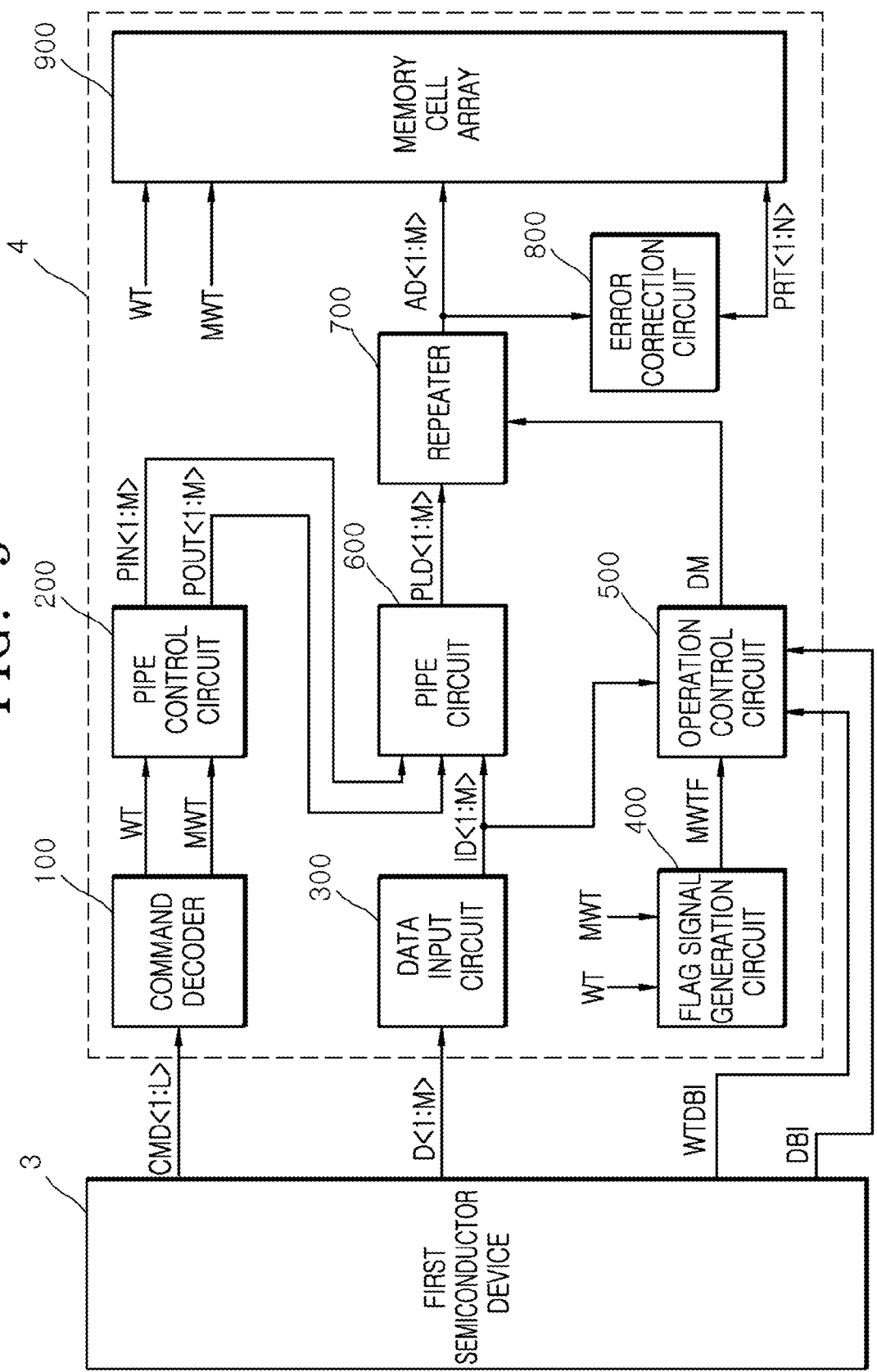
FIG. 9 is a block diagram illustrating a semiconductor system according to an embodiment of the present disclosure.

Referring to FIG. 9, a semiconductor system according to an embodiment may include a first semiconductor device 3 and a second semiconductor device 4.

The first semiconductor device 3 may apply a command CMD<1:L>, data D<1:M>, a write data control signal WTDBI and a data inversion control signal DBI to the second semiconductor device 4. The command CMD<1:L> may be set to have various logic level combinations for controlling operations of the second semiconductor device 4. The number "L" of bits included in the command CMD<1:L> may be set to be different according to the embodiments. The number "M" of bits included in the data D<1:M> may be set to be different according to the embodiments. The write data control signal WTDBI may be set to be a signal which is enabled to perform a data bus inversion operation during a write operation and a masked write operation. The data inversion control signal DBI may be set to be a signal which is enabled to perform the data bus inversion operation.

The second semiconductor device 4 may include a command decoder 100, a pipe control circuit 200, a data input circuit 300, a flag signal generation circuit 400, an operation control circuit 500, a pipe circuit 600, a repeater 700, an error correction circuit 800 and a memory cell array 900.

The command decoder 100 may decode the command CMD<1:L> to generate a write command WT and a masked write command MWT. The write command WT may be set as a signal for performing the write operation that stores the data D<1:M> into the second semiconductor device 4. The masked write command MWT may be set as a signal for performing the masked write operation that successively executes the write operation after an internal read operation of the second semiconductor device 4. Logic level combinations of the command CMD<1:L> for generating the write command WT and the masked write command MWT may be set to be different according to the embodiments.

The pipe control circuit 200 may generate a pipe input control signal PIN<1:M> and a pipe output control signal POUT<1:M> according to the write command WT and the masked write command MWT. If the write operation is performed, the pipe control circuit 200 may sequentially generate the pipe input control signal PIN<1:M> and the pipe output control signal POUT<1:M>. If the write command WT is generated, the pipe control circuit 200 may sequentially generate the pipe input control signal PIN<1:M> and the pipe output control signal POUT<1:M>. If the masked write operation is performed, the pipe control circuit 200 may sequentially generate the pipe input control signal PIN<1:M> and the pipe output control signal POUT<1:M>. If the masked write command MWT is generated, the pipe control circuit 200 may sequentially generate the pipe input control signal PIN<1:M> and the pipe output control signal POUT<1:M>. The pipe control circuit 200 may generate the pipe input control signal PIN<1:M> at a point of time that a first delay period elapses from a point of time that the write command WT or the masked write command MWT is generated. The pipe control circuit 200 may generate the pipe output control signal POUT<1:M> at a point of time that a second delay period elapses from a point of time that the pipe input control signal PIN<1:M> is generated. The first delay period and the second delay period may be set to be different according to the embodiments.

The data input circuit 300 may generate internal data ID<1:M> from the data D<1:M>. The data input circuit 300 may buffer the data D<1:M> outputted from the first semiconductor device 3 to generate the internal data ID<1:M> while the write operation is performed.

The flag signal generation circuit 400 may shift the write command WT and the masked write command MWT by a predetermined period to generate a flag signal MWTF. The predetermined period may be set as an operation time for detecting the number of bits having a predetermined logic level among the bits included in the internal data ID<1:M>. The predetermined logic level for the internal data ID<1:M> may be set as a logic "low" level. The flag signal generation circuit 400 may be realized using substantially the same circuit as the flag signal generation circuit 40 illustrated in FIG. 2. Thus, a description of the flag signal generation circuit 400 will be omitted hereinafter.

The operation control circuit 500 may generate an operation control signal DM for performing the data bus inversion operation from the data inversion control signal DBI if the write data control signal WTDBI is not inputted to the operation control circuit 500. The operation control circuit 500 may detect the number of the predetermined logic levels included in the internal data ID<1:M> if the write data control signal WTDBI is inputted to the operation control circuit 500 and the flag signal MWTF is enabled. The operation control circuit 500 may generate the operation control signal DM for performing a data masking operation of the internal data ID<1:M> according to the detection result for the number of the predetermined logic levels included in the internal data ID<1:M>. The operation control signal DM may be enabled if the number of the predetermined logic levels included in the internal data ID<1:M> is equal to or greater than a predetermined number.

The pipe circuit 600 may generate latch data PLD<1:M> from the internal data ID<1:M> according to the pipe input control signal PIN<1:M> and the pipe output control signal POUT<1:M>. The pipe circuit 600 may latch the internal data ID<1:M> if the pipe input control signal PIN<1:M> is enabled. The pipe circuit 600 may output the latched data of the internal data ID<1:M> as the latch data PLD<1:M> if the pipe output control signal POUT<1:M> is enabled. The pipe circuit 600 may be realized using substantially the same circuit as the pipe circuit 60 illustrated in FIG. 5. Thus, a description of the pipe circuit 600 will be omitted hereinafter.

The repeater 700 may perform the data bus inversion operation according to the operation control signal DM to generate aligned data AD<1:M> from the latch data PLD<1:M> if the write data control signal WTDBI is not inputted to the repeater 700. The repeater 700 may inversely buffer the latch data PLD<1:M> to generate the aligned data AD<1:M> if the write data control signal WTDBI is not inputted to the repeater 700 and the operation control signal DM is enabled. The repeater 700 may buffer the latch data PLD<1:M> to generate the aligned data AD<1:M> if the write data control signal WTDBI is not inputted to the repeater 700 and the operation control signal DM is disabled.

The error correction circuit 800 may detect errors of the aligned data AD<1:M> to generate a parity PRT<1:N> including information on the errors of the aligned data AD<1:M> while the write operation is performed. The error correction circuit 800 may correct the errors of the aligned data AD<1:M> according to the parity PRT<1:N> outputted from the memory cell array 900 while the internal read operation is performed during the masked write operation. The error correction circuit 800 may detect the errors of the aligned data AD<1:M> to generate the parity PRT<1:N> including the error information while the write operation is performed during the masked write operation.

The memory cell array 900 may store the aligned data AD<1:M> and the parity PRT<1:N> during the write operation. The memory cell array 900 may store the aligned data AD<1:M> and the parity PRT<1:N> if the write command WT is generated. The memory cell array 900 may store corrected data of the aligned data AD<1:M> and the parity PRT<1:N> after outputting the aligned data AD<1:M> and the parity PRT<:N> stored therein while the masked write operation is performed. The memory cell array 900 may output the aligned data AD<1:M> and the parity PRT<1:N> stored therein during the internal read operation if the masked write command MWT is generated. The memory cell array 900 may store the corrected data of the aligned data AD<1:M> and the parity PRT<1:N> during the write operation if the masked write command MWT is generated. The memory cell array 900 may include a region for storing the aligned data AD<1:M> and a region for storing the parity PRT<1:N>.

The second semiconductor device 4 may perform the data bus inversion operation of the data D<1:M> according to the data inversion control signal DBI if the write data control signal WTDBI is not inputted to the second semiconductor device 4 during the write operation. The second semiconductor device 4 may detect the number of the predetermined logic levels included in the data D<1:M> and may perform the data masking operation of the data D<1:M> according to the detection results, if the write data control signal WTDBI is inputted to the second semiconductor device 4 during the masked write operation.

Figure 10:
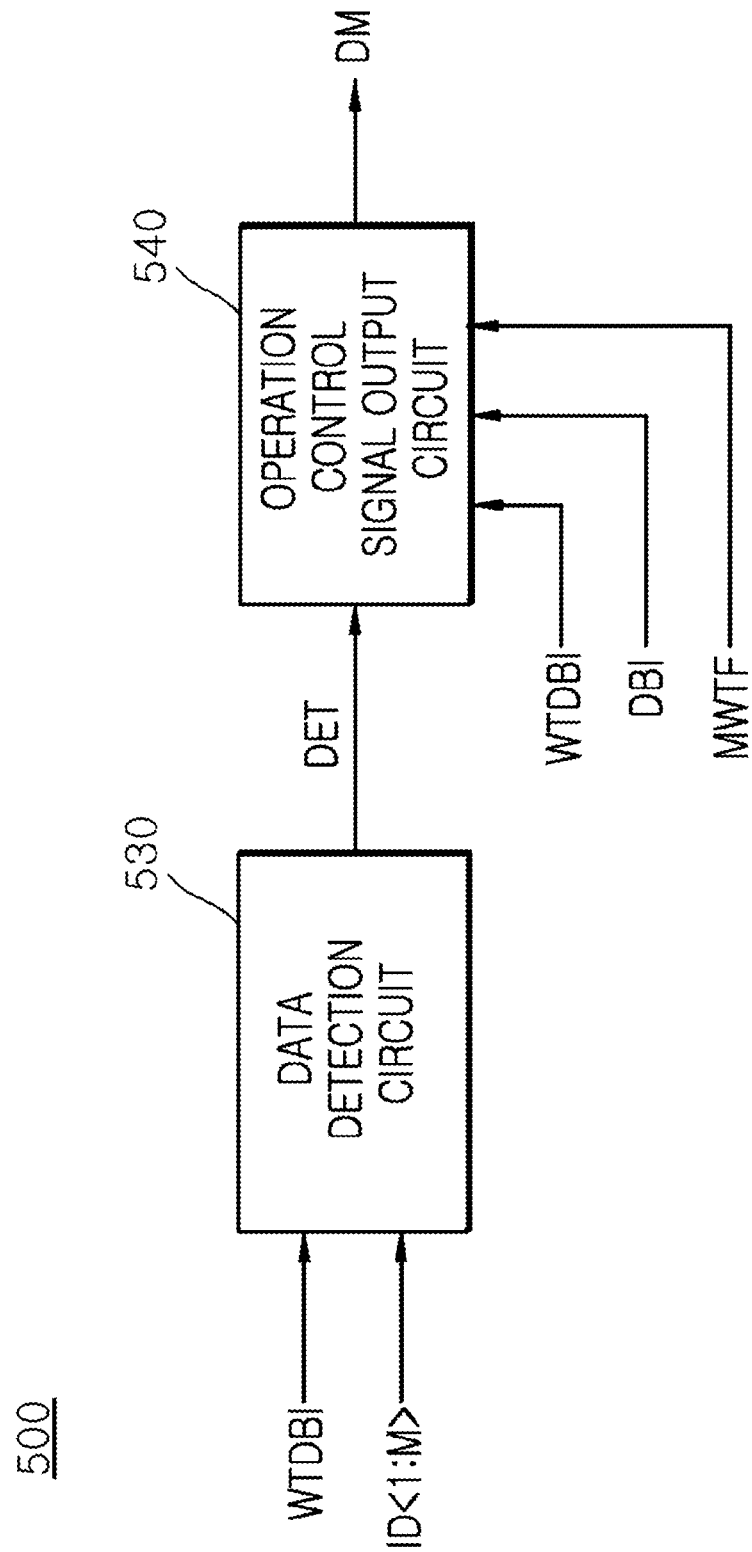
FIG. 10 is a block diagram illustrating a configuration of an operation control circuit included in a second semiconductor device of the semiconductor system shown in FIG. 9.

Referring to FIG. 10, the operation control circuit 500 may include a data detection circuit 530 and an operation control signal output circuit 540.

The data detection circuit 530 may detect logic levels of the internal data ID<1:M> according to the write data control signal WTDBI to generate a detection signal DET. The data detection circuit 530 may detect the number of logic "low" levels included in the internal data ID<1:M> to generate the detection signal DET, if the write data control signal WTDBI is enabled. The data detection circuit 530 may generate the detection signal DET which is enabled if the write data control signal WTDBI is enabled and the number of logic "low" levels included in the internal data ID<1:M> is at least two.

The operation control signal output circuit 540 may generate the operation control signal DM from the data inversion control signal DBI if the write data control signal WTDBI is not inputted to the operation control signal output circuit 540. The operation control signal output circuit 540 may buffer the detection signal DET to output the buffered signal of the detection signal DET as the operation control signal DM if the write data control signal WTDBI is inputted to the operation control signal output circuit 540 and the flag signal MWTF is enabled. The operation control signal output circuit 540 may delay the detection signal DET to generate the operation control signal DM. A delay time of the detection signal DET may be set to be different according to the embodiments.

Figure 11:
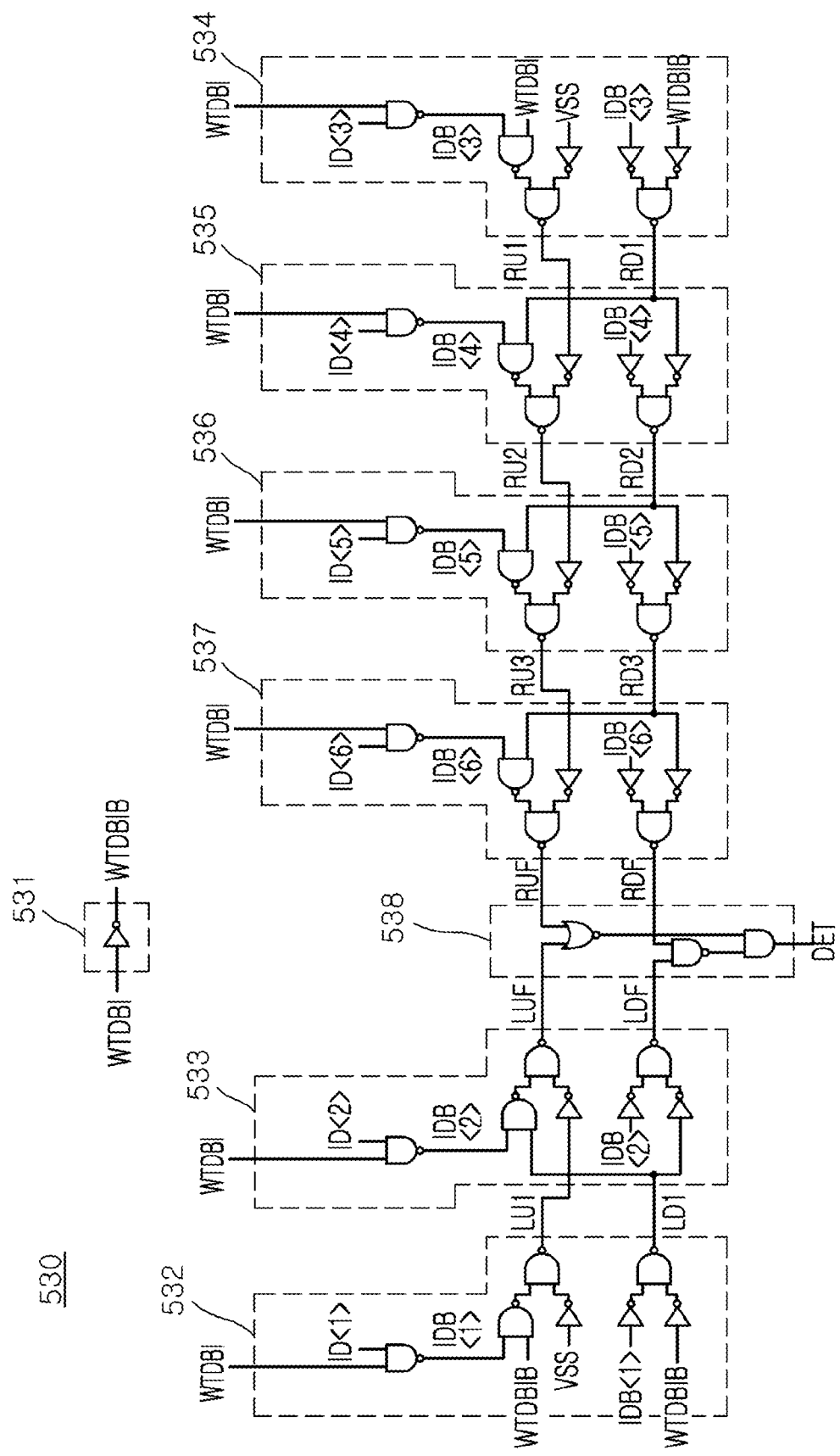
FIG. 11 is a circuit diagram illustrating a configuration of a data detection circuit included in the operation control circuit of FIG. 10.

Referring to FIG. 11, the data detection circuit 530 may include an inversion circuit 531, a first discrimination circuit 532, a second discrimination circuit 533, a third discrimination circuit 534, a fourth discrimination circuit 535, a fifth discrimination circuit 536, a sixth discrimination circuit 537 and a detection signal generation circuit 538. In FIG. 11, it may be assumed that the number 'M' of bits included in the internal data ID<1:M> is six. That is, the internal data ID<1:M> may include first to sixth internal data ID<1:6>.

The inversion circuit 531 may inversely buffer the write data control signal WTDBI to generate an inverted write data control signal WTDBIB.

The first discrimination circuit 532 may inversely buffer the first internal data ID<1> to generate a first inverted internal data IDB<1> if the write data control signal WTDBI is enabled to have a logic "high" level. The first discrimination circuit 532 may generate a first left-up signal LU1 having a logic "low" level regardless of the first inverted internal data IDB<1> if the inverted write data control signal WTDBIB is generated to have a logic "low" level. The first discrimination circuit 532 may buffer the first inverted internal data IDB<1> to generate a first left-down signal LD1 if the inverted write data control signal WTDBIB is generated to have a logic "low" level. The first discrimination circuit 532 may generate the first left-down signal LD1 which is enabled to have a logic "high" level if the inverted write data control signal WTDBIB has a logic "low" level and the first inverted internal data IDB<1> has a logic "high" level. In an embodiment, the first discrimination circuit 532 may perform inversion, NAND operations, and AND operations, and may include a combination of inverters, NAND logic gates, and AND logic gates as illustrated in FIG. 11. In an embodiment, the first discrimination circuit 532 may receive a ground voltage VSS.

The second discrimination circuit 533 may inversely buffer the second internal data ID<2> to generate a second inverted internal data IDB<2> if the write data control signal WTDBI is enabled to have a logic "high" level. The second discrimination circuit 533 may generate a left-up flag LUF having a logic "low" level regardless of the second inverted internal data IDB<2> if the first left-up signal LU1 is generated to have a logic "low" level and the first left-down signal LD1 is generated to have a logic "low" level. The second discrimination circuit 533 may buffer the second inverted internal data IDB<2> to generate a left-down flag LDF if the first left-down signal LD1 is generated to have a logic "low" level. The second discrimination circuit 533 may buffer the second inverted internal data IDB<2> to generate the left-up flag LUF if the first left-up signal LU1 is generated to have a logic "low" level and the first left-down signal LD1 is generated to have a logic "high" level. The second discrimination circuit 533 may generate the left-down flag LDF which is enabled to have a logic "high" level regardless of the second inverted internal data IDB<2> if the first left-down signal LD1 is generated to have a logic "high" level. In an embodiment, the second discrimination circuit 533 may perform inversion, NAND operations, and AND operations, and may include a combination of inverters, NAND logic gates, and AND logic gates as illustrated in FIG. 11.

The third discrimination circuit 534 may inversely buffer the third internal data ID<3> to generate a third inverted internal data IDB<3> if the write data control signal WTDBI is enabled to have a logic "high" level. The third discrimination circuit 534 may generate a first right-up signal RU1 having a logic "low" level regardless of the third inverted internal data IDB<3> if the inverted write data control signal WTDBIB is generated to have a logic "low" level. The third discrimination circuit 534 may buffer the third inverted internal data IDB<3> to generate a first right-down signal RD1 if the inverted write data control signal WTDBIB is generated to have a logic "low" level. The third discrimination circuit 534 may generate the first right-down signal RD1 which is enabled to have a logic "high" level if the inverted write data control signal WTDBIB has a logic "low" level and the third inverted internal data IDB<3> has a logic "high" level. In an embodiment, the third discrimination circuit 534 may perform inversion, NAND operations, and AND operations, and may include a combination of inverters, NAND logic gates, and AND logic gates as illustrated in FIG. 11. In an embodiment, the third discrimination circuit 534 may receive a ground voltage VSS.

The fourth discrimination circuit 535 may inversely buffer the fourth internal data ID<4> to generate a fourth inverted internal data IDB<4> if the write data control signal WTDBI is enabled to have a logic "high" level. The fourth discrimination circuit 535 may generate a second right-up signal RU2 having a logic "low" level regardless of the fourth inverted internal data IDB<4> if the first right-up signal RU1 is generated to have a logic "low" level and the first right-down signal RD1 is generated to have a logic "low" level. The fourth discrimination circuit 535 may buffer the fourth inverted internal data IDB<4> to generate a second right-down signal RD2 if the first right-down signal RD1 is generated to have a logic "low" level. The fourth discrimination circuit 535 may buffer the fourth inverted internal data IDB<4> to generate the second right-up signal RU2 if the first right-up signal RU1 is generated to have a logic "low" level and the first right-down signal RD1 is generated to have a logic "high" level. The fourth discrimination circuit 535 may generate the second right-down signal RD2 which is enabled to have a logic "high" level regardless of the fourth inverted internal data IDB<4> if the first right-down signal RD1 is generated to have a logic "high" level. In an embodiment, the fourth discrimination circuit 535 may perform inversion, NAND operations, and AND operations, and may include a combination of inverters, NAND logic gates, and AND logic gates as illustrated in FIG. 11.

The fifth discrimination circuit 536 may inversely buffer the fifth internal data ID<5> to generate a fifth inverted internal data IDB<5> if the write data control signal WTDBI is enabled to have a logic "high" level. The fifth discrimination circuit 536 may generate a third right-up signal RU3 having a logic "low" level regardless of the fifth inverted internal data IDB<5> if the second right-up signal RU2 is generated to have a logic "low" level and the second right-down signal RD2 is generated to have a logic "low" level. The fifth discrimination circuit 536 may buffer the fifth inverted internal data IDB<5> to generate a third right-down signal RD3 if the second right-down signal RD2 is generated to have a logic "low" level. The fifth discrimination circuit 536 may buffer the fifth inverted internal data IDB<5> to generate the third right-up signal RU3 if the second right-up signal RU2 is generated to have a logic "low" level and the second right-down signal RD2 is generated to have a logic "high" level. The fifth discrimination circuit 536 may generate the third right-down signal RD3 which is enabled to have a logic "high" level regardless of the fifth inverted internal data IDB<5> if the second right-down signal RD2 is generated to have a logic "high" level. In an embodiment, the fifth discrimination circuit 536 may perform inversion, NAND operations, and AND operations, and may include a combination of inverters, NAND logic gates, and AND logic gates as illustrated in FIG. 11.

The sixth discrimination circuit 537 may inversely buffer the sixth internal data ID<6> to generate a sixth inverted internal data IDB<6> if the write data control signal WTDBI is enabled to have a logic "high" level. The sixth discrimination circuit 537 may generate a right-up flag RUF having a logic "low" level regardless of the sixth inverted internal data IDB<6> if the third right-up signal RU3 is generated to have a logic "low" level and the third right-down signal RD3 is generated to have a logic "low" level. The sixth discrimination circuit 537 may buffer the sixth inverted internal data IDB<6> to generate a right-down flag RDF if the third right-down signal RD3 is generated to have a logic "low" level. The sixth discrimination circuit 537 may buffer the sixth inverted internal data IDB<6> to generate the right-up flag RUF if the third right-up signal RU3 is generated to have a logic "low" level and the third right-down signal RD3 is generated to have a logic "high" level. The sixth discrimination circuit 537 may generate the right-down flag RDF which is enabled to have a logic "high" level regardless of the sixth inverted internal data IDB<6> if the third right-down signal RD3 is generated to have a logic "high" level. In an embodiment, the sixth discrimination circuit 537 may perform inversion, NAND operations, and AND operations, and may include a combination of inverters, NAND logic gates, and AND logic gates as illustrated in FIG. 11.

The detection signal generation circuit 538 may generate the detection signal DET which is disabled to have a logic "low" level if any one of the left-up flag LUF and the right-up flag RUF has a logic "high" level. The detection signal generation circuit 538 may generate the detection signal DET which is disabled to have a logic "low" level if both of the left-down flag LDF and the right-down flag RDF have a logic "high" level. The detection signal generation circuit 538 may generate the detection signal DET which is enabled to have a logic "high" level if both of the left-up flag LUF and the right-up flag RUF have a logic "low" level and any one of the left-down flag LDF and the right-down flag RDF has a logic "low" level. In an embodiment, the detection signal generation circuit 538 may perform NOR operations, NAND operations, and AND operations, and may include a combination of NOR logic gates, NAND logic gates, and AND logic gates as illustrated in FIG. 11.

The data detection circuit 530 may generate the detection signal DET which is disabled to have a logic "low" level if the number of bits having a logic "low" level among the first to sixth internal data ID<1:6> is at least two. The data detection circuit 530 may generate the detection signal DET which is enabled to have a logic "high" level if the number of bits having a logic "high" level among the first to sixth internal data ID<1:6> is at most one. Although FIG. 11 illustrates an example in which the data detection circuit 530 is realized to detect logic levels of six internal data, the number of bits included in the internal data may be set to be less or more than six according to the embodiments.

Figure 12:
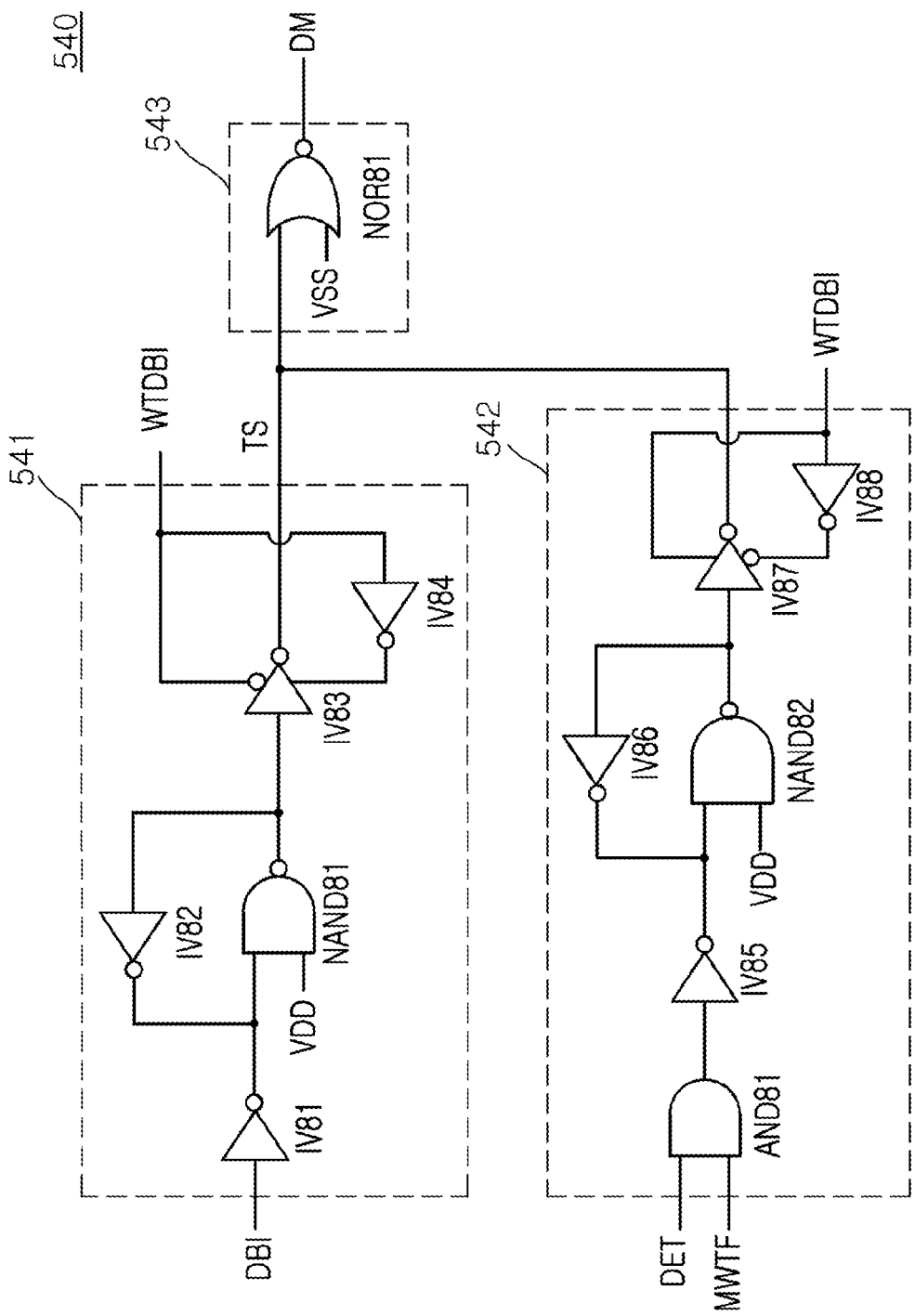
FIG. 12 is a circuit diagram illustrating a configuration of an operation control signal output circuit included in the operation control circuit of FIG. 10.

Referring to FIG. 12, the operation control signal output circuit 540 may include a first signal transmission circuit 541, a second signal transmission circuit 542 and a logic circuit 543.

The first signal transmission circuit 541 may perform inversion and NAND logic operations and may include, for example but not limited to, inverters IV81, IV82, IV83 and IV84 and a NAND gate NAND81. The first signal transmission circuit 541 may generate a transmission signal TS from the data inversion control signal DBI according to a logic level of the write data control signal WTDBI. The first signal transmission circuit 541 may inversely buffer the data inversion control signal DBI to output the inversely buffered signal of the data inversion control signal DBI as the transmission signal TS if the write data control signal WTDBI is disabled to have a logic "low" level. In an embodiment, the first signal transmission circuit 541 may receive a supply voltage VDD.

The second signal transmission circuit 542 may perform AND logic operations, NAND logic operations, and inversion operations and may include, for example but not limited to, an AND gate AND81, inverters IV85, IV86, IV87 and IV88 and a NAND gate NAND82. The second signal transmission circuit 542 may generate the transmission signal TS from the detection signal DET according to logic levels of the write data control signal WTDBI and the flag signal MWTF. The second signal transmission circuit 542 may inversely buffer the detection signal DET to output the inversely buffered signal of the detection signal DET as the transmission signal TS if both of the write data control signal WTDBI and the flag signal MWTF are enabled to have a logic "high" level. In an embodiment, the second signal transmission circuit 542 may receive a supply voltage VDD.

The logic circuit 543 may perform NOR logic operations and may include, for example but not limited to, a NOR gate NOR81. The logic circuit 543 may inversely buffer the transmission signal TS to output the inversely buffered signal of the transmission signal TS as the operation control signal DM. In an embodiment, the logic circuit 543 may receive a ground voltage VSS.

Figure 13:
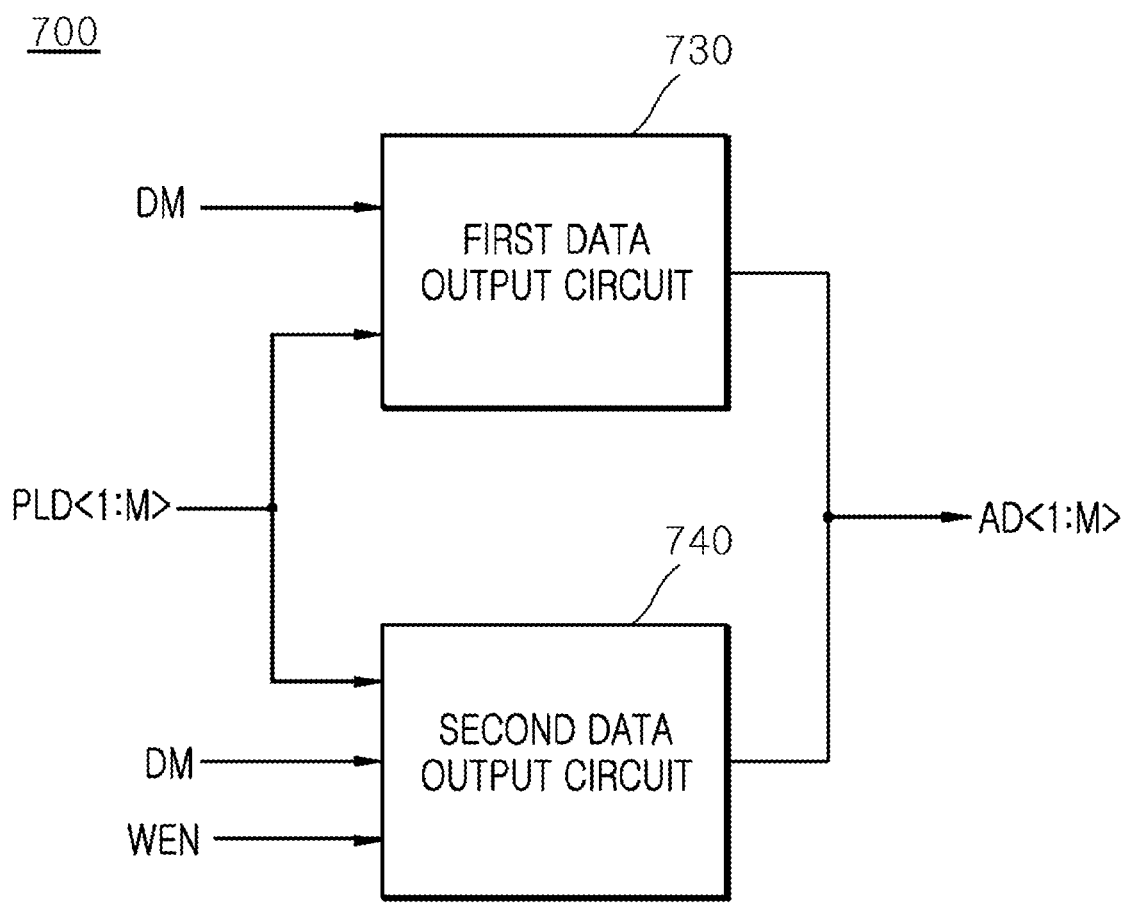
FIG. 13 is a block diagram illustrating a configuration of a repeater included in a second semiconductor device of the semiconductor system shown in FIG. 9.

Referring to FIG. 13, the repeater 700 may include a first data output circuit 730 and a second data output circuit 740.

The first data output circuit 730 may perform the data bus inversion operation according to a logic level of the operation control signal DM to generate the aligned data AD<1:M> from the latch data PLD<1:M>. The first data output circuit 730 may buffer or inversely buffer the latch data PLD<1:M> according to a logic level of the operation control signal DM to generate the aligned data.

The second data output circuit 740 may perform the data masking operation according to the operation control signal DM and a write enablement signal WEN to generate the aligned data AD<1:M> from the latch data PLD<1:M>. The second data output circuit 740 may output the latch data PLD<1:M> as the aligned data AD<1:M> or may interrupt the input of the latch data PLD<1:M>, according to the operation control signal DM and the write enablement signal WEN.

Figure 14:
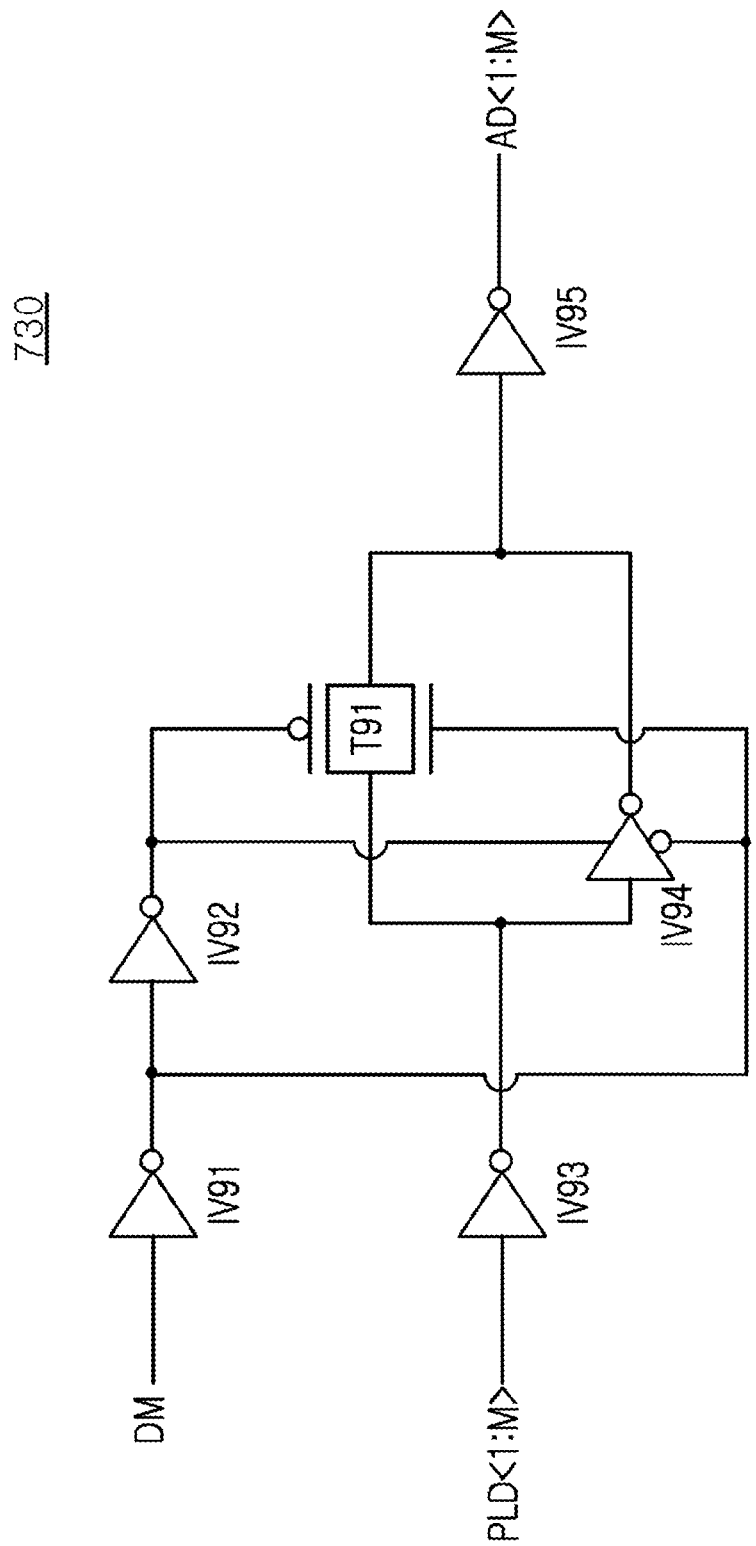
FIG. 14 is a circuit diagram illustrating a configuration of a first data output circuit included in the repeater of FIG. 13.

Referring to FIG. 14, the first data output circuit 730 may perform inversion operations and transfer gate operations and may include, for example but not limited to, inverters IV91, IV92, IV93, IV94 and IV95 and a transfer gate T91. The inverter IV94 may be realized using a three-phase inverter.

The inverters IV91 and IV92 may be sequentially coupled in series, and the operation control signal DM may be applied to an input terminal of the inverter IV91. An output terminal of the inverter IV91 may be coupled to a positive control terminal of the transfer gate T91, and an output terminal of the inverter IV92 may be coupled to a negative control terminal of the transfer gate T91. In addition, the output terminal of the inverter IV91 may be coupled to a negative control terminal of the inverter IV94, and the output terminal of the inverter IV92 may be coupled to a positive control terminal of the inverter IV94. The latch data PLD<1:M> may be applied to an input terminal of the inverter IV93, and an output terminal of the inverter IV93 may be coupled to both of an input terminal of the transfer gate T91 and an input terminal of the inverter IV94. An output terminal of the transfer gate T91 and an output terminal of the inverter IV94 may be coupled to an input terminal of the inverter IV95, and the aligned data AD<1:M> may be outputted through an output terminal of the inverter IV95.

If the operation control signal DM has a logic "high" level, the transfer gate T91 may be turned off and the inverter IV94 may be turned on. In such a case, the latch data PLD<1:M> may be inversely buffered through the inverters IV93, IV94 and IV95 to generate the aligned data AD<1:M>.

If the operation control signal DM has a logic "low" level, the transfer gate T91 may be turned on and the inverter IV94 may be turned off. In such a case, the latch data PLD<1:M> may be buffered through the inverters IV93 and IV95 and the transfer gate T91 to generate the aligned data AD<1:M>.

Although FIG. 14 illustrates the first data output circuit 730 with a single circuit including the inverters IV91~IV95 and the transfer gate T91, the first data output circuit 730 may actually be realized using "M"-number of circuits, each of which receives one of the bits included in the latch data PLD<1:M>.

Figure 15:
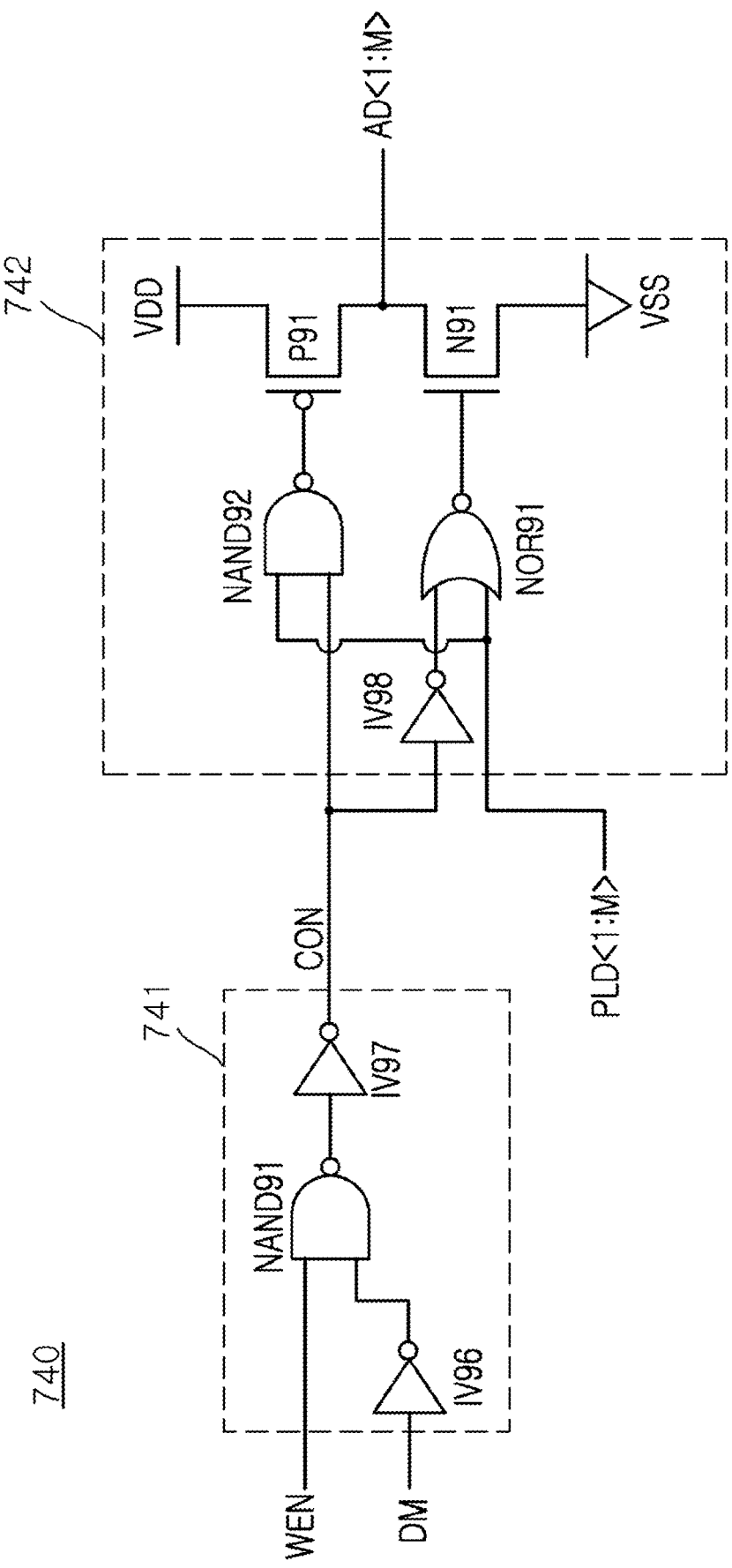
FIG. 15 is a circuit diagram illustrating a configuration of a second data output circuit included in the repeater of FIG. 13.

Referring to FIG. 15, the second data output circuit 740 may include a control signal generation circuit 741 and a buffer circuit 742.

The control signal generation circuit 741 may perform inversion and NAND operation and may include, for example but not limited to, inverters IV96 and IV97 and a NAND gate NAND91.

The control signal generation circuit 741 may generate a control signal CON according to a logic level of the operation control signal DM during a period that the write enablement signal WEN is enabled. The control signal generation circuit 741 may generate the control signal CON having a logic "high" level if the operation control signal DM has a logic "low" level during a period that the write enablement signal WEN is enabled to have a logic "high" level. The control signal generation circuit 741 may generate the control signal CON having a logic "low" level if the operation control signal DM has a logic "high" level during a period that the write enablement signal WEN is enabled to have a logic "high" level. The write enablement signal WEN may be set as a signal which is enabled to have a logic "high" level while the masked write operation is performed.

The buffer circuit 742 may perform inversion operations, NOR operations, pull-up and pull-down operations, and NAND operations and may include, for example but not limited to, an inverter IV98, a NAND gate NAND92, a NOR gate NOR91, a PMOS transistor P91 and an NMOS transistor N91. The buffer circuit 742 may generate the aligned data AD<1:M> from the latch data PLD<1:M> according to a logic level of the control signal CON. The buffer circuit 742 may buffer the latch data PLD<1:M> to generate the aligned data AD<1:M> if the control signal CON has a logic "high" level. The buffer circuit 742 may interrupt the input of the latch data PLD<1:M> if the control signal CON has a logic "low" level. In an embodiment, the PMOS transistor P91 receives a supply voltage VDD and the NMOS transistor N91 receives a ground voltage VSS.

Although FIG. 15 illustrates the second data output circuit 740 with a single circuit including the control signal generation circuit 741 and the buffer circuit 742, the second data output circuit 740 may actually be realized using "M"-number of circuits, each of which corresponds to one of the bits included in the latch data PLD<1:M>.

As described above, a semiconductor system according to an embodiment may perform a data bus inversion operation based on a data inversion control signal during a write operation. The semiconductor system may interrupt the execution of a data masking operation by disabling a flag signal after a predetermined period for detecting a predetermined logic level included in data during the write operation. The semiconductor system may detect the predetermined logic level included in the data to perform a data masking operation according to the detection results during a masked write operation. Thus, the semiconductor system may perform the data masking operation only during the masked write operation to prevent errors of the write operation from occurring because no parity is generated from masked data during the write operation.

According to the embodiments described above, the data bus inversion operation may be performed by the data inversion control signal provided by an external device during the write operation, and the data masking operation may be performed according to a detection result of the predetermined logic level included in the data during the masked write operation. Thus, the semiconductor system may provide the data bus inversion operation and the data masking operation.

Figure 16:
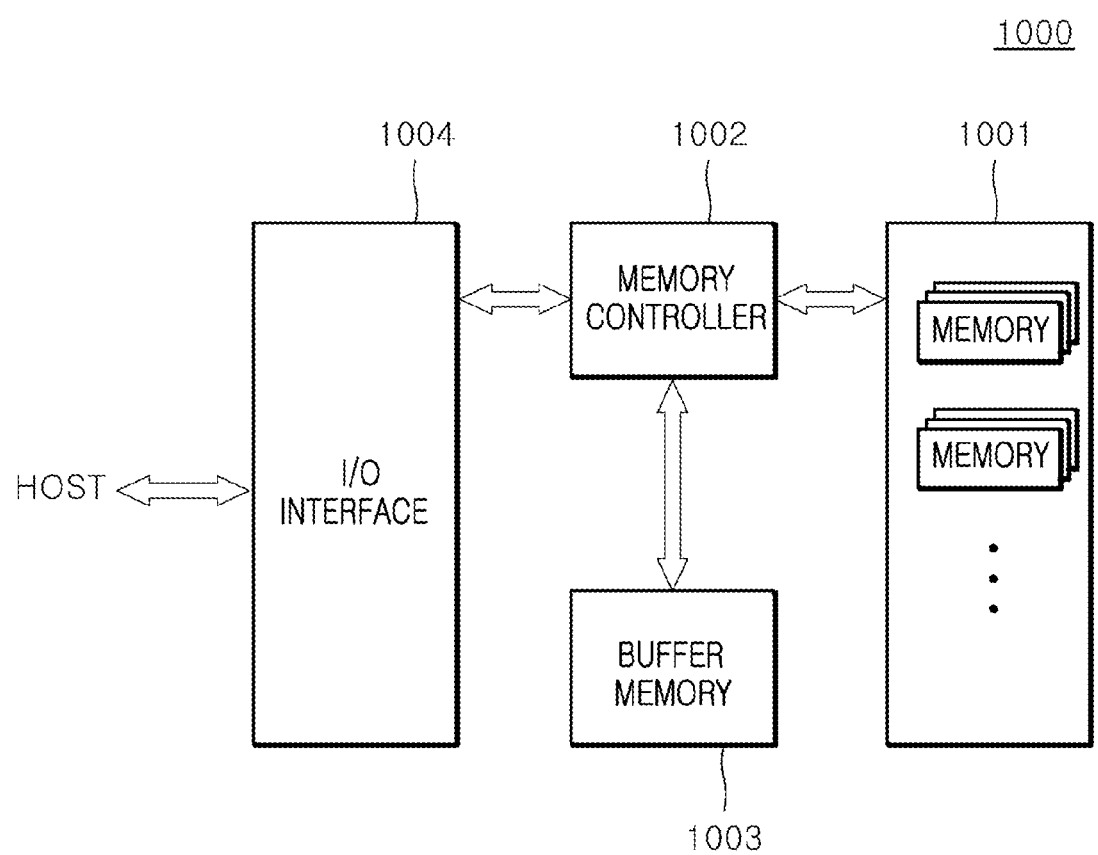
FIG. 16 is a block diagram illustrating a configuration of an electronic system employing at least one of the semiconductor systems shown in FIGS. 1 to 15.

The semiconductor systems described with reference to FIGS. 1 to 15 may be applied to an electronic system that includes a memory system, a graphic system, a computing system, a mobile system, or the like. For example, as illustrated in FIG. 16, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1 or the first semiconductor device 3 illustrated in FIG. 9. Although FIG. 16 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may include the second semiconductor device 2 illustrated in FIG. 1 or the second semiconductor device 4 illustrated in FIG. 9. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a flag signal generation circuit configured to shift a masked write command by a predetermined period to generate a flag signal; and
   an operation control circuit configured to generate an operation control signal for performing a data masking operation of internal data according to logic levels of the internal data when a write data control signal is inputted to the operation control circuit and the flag signal is enabled, and
   wherein the masked write command is inputted to the flag signal generation circuit for performing a masked write operation for successively executing an internal read operation and a write operation.

2. The semiconductor device of claim 1, wherein the write data control signal is received by the semiconductor device and is inputted to the operation control circuit to perform a data bus inversion operation while a write operation and a masked write operation are performed.

3. The semiconductor device of claim 1, wherein the predetermined period for shifting the masked write command is set as an operation time for detecting the number of bits having a predetermined logic level among bits included in the internal data.

4. The semiconductor device of claim 3, wherein the predetermined logic level is a logic "low" level.

5. The semiconductor device of claim 1, wherein the operation control signal is enabled if the number of bits having a predetermined logic level among bits included in the internal data is equal to or greater than a predetermined number.

6. The semiconductor device of claim 1, wherein the flag signal generation circuit includes:
   a pulse generation circuit configured to generate an internal pulse signal including a pulse which is created when a write command and the masked write command are inputted to the pulse generation circuit;
   a shift register configured to shift the internal pulse signal to generate a write pulse signal; and
   a flag signal output circuit configured to latch and shift the masked write command by the predetermined period to generate the flag signal, at a point of time when the write pulse signal is inputted to the flag signal output circuit.

7. The semiconductor device of claim 1, wherein the operation control circuit includes:
   a data detection circuit configured to generate a detection signal which is enabled when the write data control signal and the flag signal are enabled and the number of bits having a predetermined logic level among bits included in the internal data is at least a predetermined number; and
   an operation control signal output circuit configured to buffer the detection signal to output the buffered signal of the detection signal as the operation control signal.

8. The semiconductor device of claim 1, further comprising:
   a pipe circuit configured to latch the internal data when a pipe input control signal is inputted to the pipe circuit and configured to output the latched internal data as latch data when a pipe output control signal is inputted to the pipe circuit; and
   a repeater configured to output the latch data as aligned data when the operation control signal is disabled and configured to interrupt the input of the latch data when the operation control signal is enabled.

9. The semiconductor device of claim 8, wherein the repeater includes:
   a control signal generation circuit configured to generate a control signal which is enabled when the operation control signal is enabled during a period when a write enablement signal is inputted to the control signal generation circuit; and
   a buffer circuit configured to buffer the latch data to output the buffered latch data as the aligned data when the control signal is enabled and configured to interrupt the input of the latch data when the control signal is disabled.

10. A semiconductor device comprising:
    a flag signal generation circuit configured to shift a write command and a masked write command by a predetermined period to generate a flag signal;
    an operation control circuit configured to generate an operation control signal from a data inversion control signal or configured to detect the number of bits having a predetermined logic level among bits included in internal data, according to a logic level of the flag signal; and
    a repeater configured to perform a data bus inversion operation of latch data generated from the internal data to generate aligned data or configured to perform a data masking operation of the latch data to generate the aligned data, according to the operation control signal.

11. The semiconductor device of claim 10,
wherein the data bus inversion operation is an operation for inverting logic levels of bits included in the latch data; and
wherein the data masking operation is an operation for interrupting the input of the latch data.

12. The semiconductor device of claim 10, wherein the predetermined period for shifting the masked write command is set as an operation time for detecting the number of the bits having the predetermined logic level among the bits included in the internal data.

13. The semiconductor device of claim 10, wherein the predetermined logic level is a logic "low" level.

14. The semiconductor device of claim 10, wherein the operation control signal is generated from the data inversion control signal or enabled when the number of the predetermined logic level included in the internal data is equal to or greater than a predetermined number.

15. The semiconductor device of claim 10, wherein the flag signal generation circuit includes:
a pulse generation circuit configured to generate an internal pulse signal including a pulse which is created when the write command and the masked write command are inputted to the pulse generation circuit;
a shift register configured to shift the internal pulse signal to generate a write pulse signal; and
a flag signal output circuit configured to latch and shift the masked write command by the predetermined period to generate the flag signal, at a point of time when the write pulse signal is inputted to the flag signal output circuit.

16. The semiconductor device of claim 10, wherein the operation control circuit includes:
a data detection circuit configured to generate a detection signal which is enabled when the write data control signal is inputted to the data detection circuit and the number of the predetermined logic level included in the internal data is equal to or greater than a predetermined number; and
an operation control signal output circuit configured to generate the operation control signal from the data inversion control signal when the write data control signal is disabled and configured to generate the operation control signal from the flag signal and the detection signal when the write data control signal is enabled.

17. The semiconductor device of claim 16, wherein the operation control signal output circuit includes:
a first signal transmission circuit configured to inversely buffer the data inversion control signal to output the inversely buffered signal of the data inversion control signal as a transmission signal when the write data control signal is disabled;
a second signal transmission circuit configured to inversely buffer the detection signal to output the inversely buffered detection signal as the transmission signal when both of the write data control signal and the flag signal are enabled; and
a logic circuit configured to inversely buffer the transmission signal to output the inversely buffered transmission signal as the operation control signal.

18. The semiconductor device of claim 10, wherein the repeater includes:
a first data output circuit configured to buffer or inversely buffer the latch data according to a logic level of the operation control signal to output the inversely buffered latch data or the buffered latch data as the aligned data; and
a second data output circuit configured to output the latch data as the aligned data or configured to interrupt the input of the latch data, according to a logic level of the operation control signal.

19. The semiconductor device of claim 18, wherein the second data output circuit includes:
a control signal generation circuit configured to generate a control signal which is enabled when the operation control signal is disabled during a period that a write enablement signal is inputted to the control signal generation circuit; and
a buffer circuit configured to buffer the latch data to output the buffered latch signal as the aligned data when the control signal is enabled and configured to interrupt the input of the latch data when the control signal is disabled.

* * * * *